(12) United States Patent
Schwartz et al.

(10) Patent No.: US 9,691,491 B2
(45) Date of Patent: Jun. 27, 2017

(54) METHODS AND APPARATUS TO TRACK BIT CELL CURRENT USING TEMPERATURE AND VOLTAGE DEPENDENT REFERENCE CURRENTS

(71) Applicant: TEXAS INSTRUMENTS INCORPORATED, Dallas, TX (US)

(72) Inventors: Kurt Stephen Schwartz, Frisco, TX (US); Patrick Robert Smith, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/858,864

(22) Filed: Sep. 18, 2015

(65) Prior Publication Data

US 2017/0084343 A1    Mar. 23, 2017

(51) Int. Cl.
*G11C 16/28* (2006.01)
*G11C 16/34* (2006.01)

(52) U.S. Cl.
CPC .......... *G11C 16/28* (2013.01); *G11C 16/3445* (2013.01)

(58) Field of Classification Search
CPC .............................. G11C 16/28; G11C 16/3445
See application file for complete search history.

(56) References Cited

U.S. PATENT DOCUMENTS

| 7,471,582 | B2* | 12/2008 | Choy | G11C 7/04 365/189.07 |
|---|---|---|---|---|
| 7,649,781 | B2 | 1/2010 | Syzdek et al. | |
| 7,969,804 | B1 | 6/2011 | Hirose et al. | |
| 2007/0274138 | A1* | 11/2007 | Ogiwara | G11C 5/147 365/189.09 |
| 2016/0211030 | A1* | 7/2016 | Chen | G11C 16/28 |

OTHER PUBLICATIONS

Jennifer Taylor, Reading and Writing Flash Memory Using Delta Sigma Modulation, Boise State University, Nov. 2004, 58 pages.

\* cited by examiner

*Primary Examiner* — Tri Hoang
(74) *Attorney, Agent, or Firm* — John R. Pessetto; Charles A. Brill; Frank D. Cimino

(57) ABSTRACT

An example method to track bit cell current in a memory architecture. An example method disclosed herein includes generating a first reference current dependent on bit cell temperature. The example method includes generating a second reference current dependent on bit cell voltage and supplying a third reference current of constant magnitude. In examples disclosed herein, the example method involves summing the first reference current, the second reference current, and the third reference current. The example method includes determining, with a sense amplifier, a bit cell logic state based on the first reference current, the second reference current, and the third reference current.

17 Claims, 7 Drawing Sheets

METHODS AND APPARATUS TO TRACK BIT CELL CURRENT USING TEMPERATURE AND VOLTAGE DEPENDENT REFERENCE CURRENTS

FIELD OF THE DISCLOSURE

This disclosure relates generally to flash memory architectures, and, more particularly, to methods and apparatus to track bit cell current using temperature and voltage dependent reference currents.

BACKGROUND

Integrated circuit devices employ memory devices to store data. Memory devices are composed of bit cells, or memory cells, with each bit cell conventionally storing one bit of data. To read data stored at a bit cell, a bit cell signal (e.g., a voltage, a current, etc.) is compared to a reference signal at a sense amplifier. The bit cell signal represents a logic state (e.g., binary 0 or 1) but, in some instances, is prone to logic state determination errors, or inaccurate determination of logic states at the sense amplifier based on memory device operating characteristics. Reference devices designed to track memory device operating characteristics and trim bit cell signals have evolved in recent years. These reference devices enable the sense amplifier to accurately read the logic state of the bit cell over a wide range of memory device operating characteristics and reduce logic state determination errors.

SUMMARY

Examples disclosed herein track bit cell current in a memory architecture. An example method disclosed herein includes generating a first reference current dependent on bit cell temperature. The example method includes generating a second reference current dependent on bit cell voltage and supplying a third reference current of constant magnitude. In examples disclosed herein, the example method involves summing the first reference current, the second reference current, and the third reference current. The example method includes determining, with a sense amplifier, a bit cell logic state based on the first reference current, the second reference current, and the third reference current.

Figure 1:
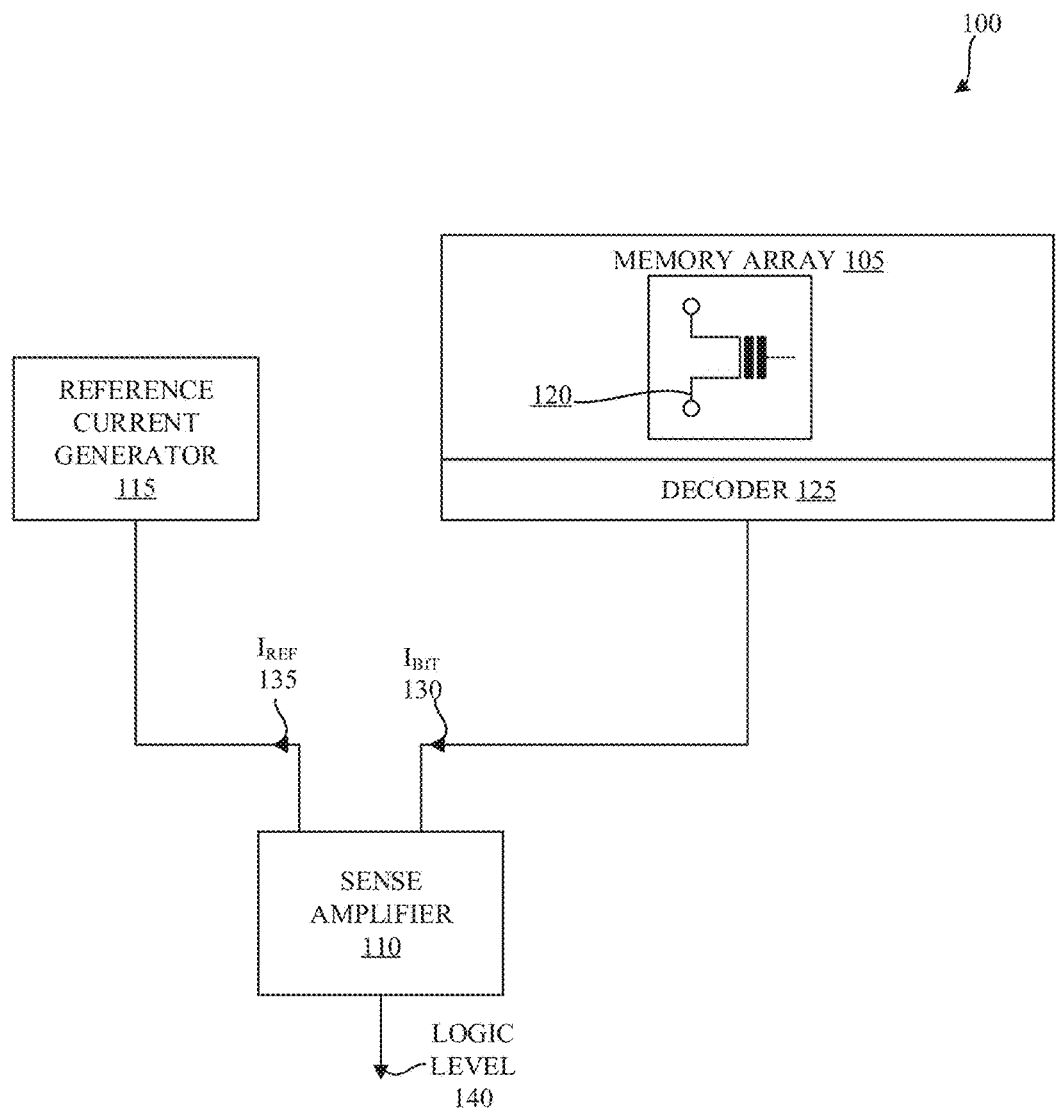
FIG. 1 is an example system that may be used to implement a memory architecture to track bit cell current in accordance with the teachings of this disclosure.

The figures are not to scale. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Programmable non-volatile memories such as, for example, flash memory, store information (e.g., bits of data) in flash arrays. As used herein, a flash array is an array of bit cells arranged in rows and columns. Programmable non-volatile memories store information as a charge, or a potential, in or on, bit cells such as, for example, floating gate transistors. In conventional memory architectures, one bit cell stores one bit of data. Information is programmed to and erased from flash memory architectures by injecting and removing charge (e.g., electrons), respectively, from bit cells of flash arrays.

Flash memories are capable of a limited number of program/erase (PE) cycles. When information is programmed to and erased from a flash bit cell, the injection and removal of charge causes wear on the bit cell such as, for example, depletion of an oxide layer of the bit cell. As the quantity of PE cycles increases over a flash memory's lifetime, and wear on bit cells accumulates, the probability of stored charge leaking from the bit cells increases. Increased bit cell leakage may result in inaccurate identification of bit cell data (e.g., a bit cell intended to store charge, or remain charge-free, may not do so due to wear effects).

Flash arrays are implemented in flash memory architectures to track and detect bit cell data stored in bit cells. In some implementations, flash arrays may generate reference currents to account for bit cell performance variability based on operating condition changes. However, flash arrays consume large quantities, or magnitudes, of current to generate reference currents and occupy large surface areas in flash memory architectures. Reducing current consumption necessary to generate reference currents and reducing surface area allocation supports low power read applications and more space-efficient flash memory architectures.

FIG. 1 depicts an example memory architecture 100 to track, or match, bit cell current. The example memory architecture includes an example memory array 105, an example sense amplifier 110, and an example reference current generator 115.

In the illustrated example, the example memory array 105 is a programmable non-volatile memory that stores data. In examples disclosed herein, the example memory array 105 is implemented using a solid state device (SSD) or a flash memory architecture. However, the example memory array 105 may be implemented using programmable read only memory (PROM), dynamic random access memory (DRAM), static random access memory (SRAM), electrically erasable read only memory (EEPROM), etc. In examples disclosed herein, the example memory array 105 may be electrically read, programmed, and erased. The example memory architecture 100 includes a plurality of memory cells such as, for example, transistors arranged in rows and columns. The example memory array 105 includes an example bit cell 120 and an example decoder 125.

The example sense amplifier 110 is a device, circuit, integrated circuit or program that reads and/or compares data in memory. The example sense amplifier 110 reads and/or compares signals provided by a memory system and determines a logic state associated with the signals. In some examples, the example sense amplifier amplifies the signals to recognizable logic levels so that data can be interpreted accurately by logic controllers outside of the memory system such as, for example, a central processing unit (CPU). In examples disclosed herein, the sense amplifier 110 may be implemented by a circuit including transistors, resistors, capacitors, inductors, etc. coupled in any manner or fashion. Although only one sense amplifier 110 is illustrated in FIG. 1, any number and/or combination(s) of sense amplifiers may exist.

The example sense amplifier 110 reads and/or receives signals provided by, or outputted from, the example memory array 105 and determines logic states. For example, the sense amplifier 110 reads a voltage or current corresponding to any number or array of memory cells in the example memory array 105 and determines a corresponding logic state(s). For example, the example sense amplifier 110 may read a magnitude of five hundred twenty millivolts from an array of memory cells, such as a flash array, and subsequently determine the voltage corresponds to a logic low state (e.g., binary 0 or 1). In some examples, the sense amplifier 110 may compare signals generated from two or more sources in the example memory architecture 100 and determine a logic state(s) based on two or more signals.

The example reference current generator 115 generates a reference current. In examples disclosed herein, the example reference current generator 115 provides an adjustable, or trim-able, reference current that tracks memory cell current in a memory system. The example reference current generator 115 provides a reference current that tracks changes in memory cell current across voltage and temperature. In examples disclosed herein, the example reference current generator 115 provides a reference current to, and/or pulls or sources a reference current from, the example sense amplifier 110.

The example bit cell 120 is a memory cell that stores one bit of binary information. The example bit cell 120 is implemented by any type(s) of transistor. For example, the example bit cell 120 may be implemented by a floating gate transistor, a silicon-oxide-nitride-oxide silicon (SONOS) transistor, a complementary metal-oxide-semiconductor (CMOS) transistor, a metal-oxide-semiconductor field-effect transistor (MOSFET), etc. Additionally, the example bit cell 120 may be implemented by a p- and/or an n-channel, or type, semiconductor device(s) and/or transistor(s). Although only one example bit cell 120 is illustrated in FIG. 1, any number and/or type(s) of bit cell may be implemented. In some examples, an array of example bit cells 120 such as, for example, a flash array, may make up the example memory array 105.

The example decoder 125 is a device, circuit, integrated circuit, or program that decodes data. The example decoder 125 decodes rows and columns of a memory system to identify memory addresses of memory cells. The example decoder 125 decodes a memory system to locate and/or identify ones of the memory cells in the memory system. Although only one decoder 125 is illustrated in FIG. 1, any number and/or type(s) of decoder(s) (e.g., a priority encoder, a multiplexor, etc.) may be implemented in the example memory architecture 100.

In examples disclosed herein, the example decoder 125 decodes the example memory array 105. The example decoder 125 may identify, access, and/or locate one or more of the bit cells 120 of the example memory array 105. In examples disclosed herein, the example decoder 125 accesses the one or more bit cells 120 and relays an electrical current or voltage, corresponding to the one or more bit cells, to the example sense amplifier 110. The electrical current may be indicative of whether or not the one more bit cells 120 store a charge or bit.

In examples disclosed herein, the example bit cell 120 may be provided a reference voltage and a read voltage. In some examples, when the read voltage is applied, the example bit cell 120 provides an example bit cell current $I_{BIT}$ 130. A magnitude, or value, of the example bit cell current $I_{BIT}$ 130 depends on a programmed level (e.g., corresponding to a logic state) of the example bit cell 120. The example decoder 125 may decode a memory address to one or more bit cells 120 and relay the example bit cell current $I_{BIT}$ 130 to the example sense amplifier 110. The example sense amplifier 110 subsequently reads the example bit cell current $I_{BIT}$ 130 and/or or compares the example bit cell current $I_{BIT}$ 130 to another current, to determine a logic state.

The example bit cell current $I_{BIT}$ 130 is sensitive to disturbances and vulnerable to fluctuations in magnitude based on changes in operating characteristics. For example, extreme temperatures (e.g., extremely hot or extremely cold) may result in substantially higher or lower bit cell current $I_{BIT}$ 130 provided to the example sense amplifier 110. This substantially higher or lower bit cell current $I_{BIT}$ 130 may cause the example sense amplifier 110 to inaccurately read and/or determine the logic state of one or more of the bit cells 120. To ensure the example sense amplifier 110 accurately reads and/or determines the logic state, regardless of changes in operating characteristics, the example sense amplifier 110 is supplied or sources a reference current from the example reference current generator 115.

In examples disclosed herein, the example reference current generator 115 generates an example reference current $I_{REF}$ 135. The example reference current $I_{REF}$ 135 is an adjustable, or trim-able, current that tracks memory cell current in the example memory architecture 100. The example reference current $I_{REF}$ 135 tracks changes in memory cell current across voltage and temperature. In examples disclosed herein, the example reference current generator 115 may provide the example reference current $I_{REF}$ 135 to, and/or pull or source the example reference current $I_{REF}$ 135 from, the example sense amplifier 110.

In examples disclosed herein, the example reference current generator 115 generates a temperature dependent reference current, a voltage dependent reference current, and a current of constant magnitude. The example reference current generator 115 sums and adjusts, or trims (e.g., to increase or decrease in magnitude), a plurality of currents and voltages to generate the example reference current $I_{REF}$ 135. The example reference current generator 115 copies, or minors, ones of the generated temperature dependent reference current, voltage dependent reference current, and the current of constant magnitude as the example reference current $I_{REF}$ 135 to the example sense amplifier 110. In some examples, the example reference current generator 115 is configured to detect a programmable non-volatile memory operation such as, for example, a read, a write, a program-verify, an erase, and/or an erase-verify operation, and subsequently generate and/or trim the example reference current $I_{REF}$ 135. In other examples, the example reference current generator 115 is configured to generate the example reference current $I_{REF}$ 135 at a magnitude or level between expected magnitudes or levels of the example bit cell current $I_{BIT}$ 130. For example, the example bit cell 120 may provide a bit cell current $I_{BIT}$ 130 of three micro-amps or less to represent a logic state "0" and a bit cell current $I_{BIT}$ 130 of nine micro-amps or more to represent a logic state "1," or vice-versa. In some examples, the example reference current generator 115 is configured to provide an example reference current $I_{REF}$ 135 of six micro-amps, between the expected magnitudes or levels of the example bit cell current $I_{BIT}$ 130 (e.g., three micro-amps and nine micro-amps).

In examples disclosed herein, the example reference current generator 115 detects read operations, write or program-verify operations and erase or erase-verify operations. A read operation is performed by a logic controller such as, for example, a CPU to read contents of ones of the example bit cells 120. In some examples, a read operation may include applying a reference voltage to a control gate(s) of the bit cell(s) 120. A write, a program, or a program-verify operation is performed by a logic controller such as, for example, a CPU to write or program data to the example bit cell(s) 120. In some examples, a write or program-verify operation includes applying a voltage to, and/or injecting electrons into, the bit cell(s) 120. An erase operation, or an erase-verify operation, is performed by a logic controller such as, for example, a CPU and/or a cache memory to erase blocks of the example memory array 105. In some examples, an erase operation may apply a voltage of opposite polarity between terminals of the example bit cell(s) 120 to release charge stored in the bit cell(s) 120. In examples disclosed herein, the example reference current generator 115 may receive signals indicative of a read, a write, a program-verify, an erase, and/or an erase-verify operation from a logic controller (e.g., CPU) outside of the example memory architecture 100.

In the illustrated example of FIG. 1, the example reference current generator 115 provides the example reference current $I_{REF}$ 135 to the example sense amplifier 110. The example reference current $I_{REF}$ 135 varies based on changes in bit cell(s) voltage and temperature. In examples disclosed herein, the example reference current generator 115 is implemented by a CMOS transistor circuit to generate the example reference current $I_{REF}$ 135. However, any type(s) of transistor(s) and/or integrated circuit may be used to implement the example reference current generator 115.

In the illustrated example, the example reference current generator 115 and the example bit cell(s) 120 provide the example reference current $I_{REF}$ 135 and the example bit cell current $I_{BIT}$ 130, respectively, to the example sense amplifier 110. The example sense amplifier 110 compares the example reference current $I_{REF}$ 135 to the example bit cell current $I_{BIT}$ 130 and determines an example logic level 140. The example logic level 140 is a logic state (e.g., binary 0 or 1) derived by the example sense amplifier 110 based on a comparison of current magnitudes. The example logic level 140 represents the logic state of data stored in the example bit cell(s) 120. The logic level 140 may be delivered to a logic controller (e.g., a CPU) for further evaluation and/or determination of subsequent instructions.

Figure 2:
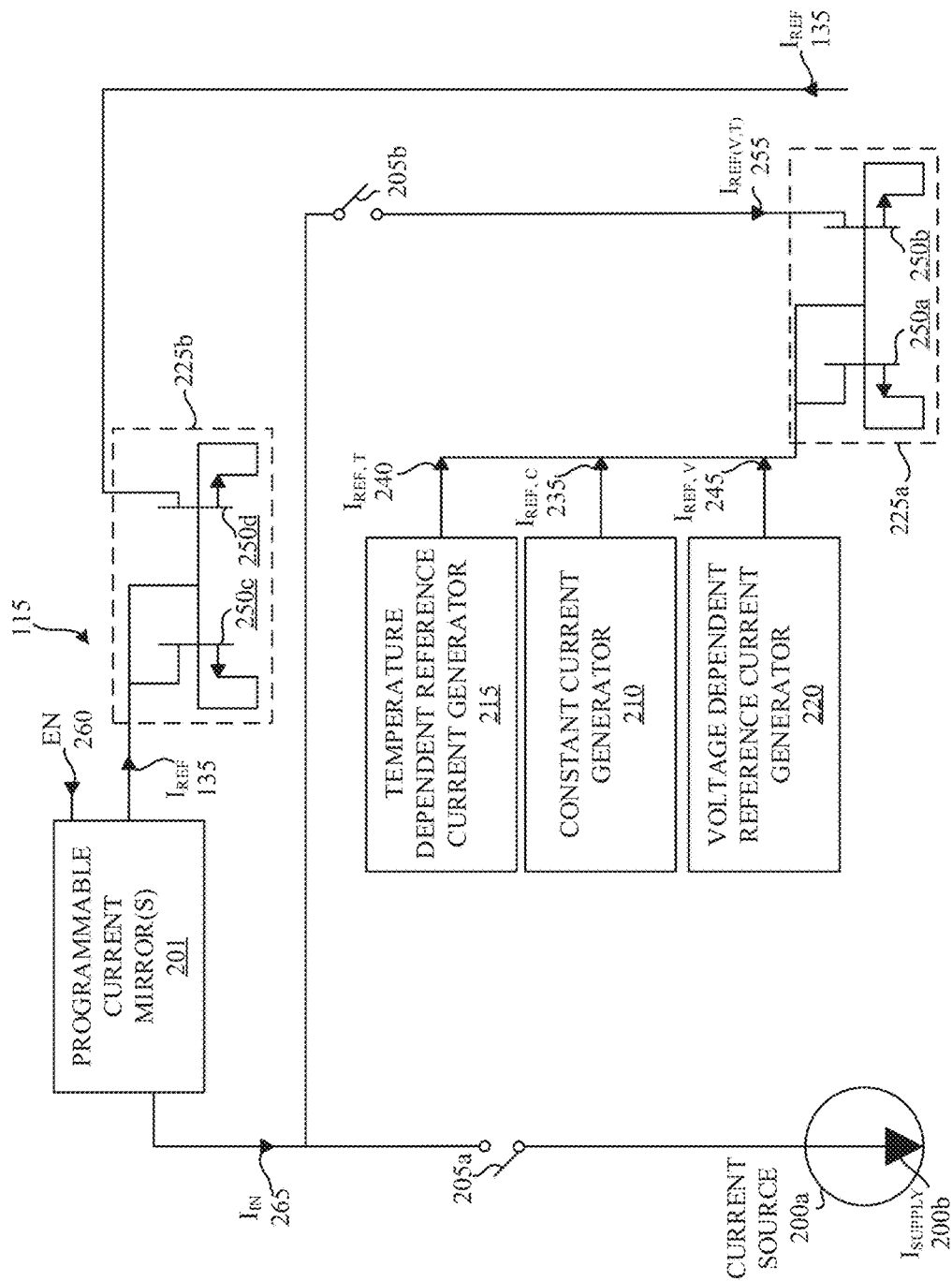
FIG. 2 is an illustration showing additional detail of an example reference current generator of FIG. 1.

FIG. 2 depicts an example implementation of the example reference current generator 115 of the example memory architecture 100. The example reference current generator 115 tracks or matches bit cell(s) current $I_{BIT}$ 130 across voltage and temperature by generating an example reference current $I_{REF}$ 135. The example reference current generator 115 includes an example current source 200a supplying or sourcing an example supply current $I_{SUPPLY}$ 200b, an example programmable current mirror(s) 201, example switches 205a-b, an example constant current generator (CCG) 210, an example temperature dependent reference current generator (TDRCG) 215, an example voltage dependent reference current generator (VDRCG) 220, and example current minors 225a-b.

The example current source 200a provides a current of constant magnitude. In examples disclosed herein, the example current source 200a supplies the example supply current $I_{SUPPLY}$ 200b, which may be an electrical current of positive or negative polarity. The example supply current $I_{SUPPLY}$ 200b is generated by any type(s) of current source(s) implemented by any type(s) of circuit(s), integrated circuit(s), transistor(s), etc. Also, the example supply current $I_{SUPPLY}$ 200b may exhibit any magnitude or value. Although the example supply current $I_{SUPPLY}$ 200b is represented as being generated within the example reference current generator 115 in the illustrated example of FIG. 2, the example supply current $I_{SUPPLY}$ 200b may be generated, supplied to and/or sourced from, the example reference current generator 115 from a current source(s) outside of the example reference current generator 115 and/or the example memory architecture 100.

The example switches 205a-b are devices, or relays, to direct current flow in the example reference current generator 115. The example switches 205a-b interrupt or break parts of an electrical circuit in the example reference current generator 115. The example switches 205a-b may be implemented by any type(s) of transistor(s) and/or electrical component. In examples disclosed herein, the example switches 205a-b may open or close upon reception of a signal from a logic controller(s) such as, for example, a CPU. In examples disclosed herein, the example reference current $I_{REF}$ 135 generated by the example reference current generator 115 varies based on a combination of switches 205a-b that are open or closed. The example switches 205a-b cause current provided to or sourced from the example programmable current mirror(s) 201 to vary. As such, the example reference current $I_{REF}$ 135 varies equally or proportionally in magnitude with the current provided to or sourced from the example programmable current mirror(s) 201. Current is delivered to and/or sourced from certain ones of the example programmable current mirror(s) 201, the example CCG 210, the example TDRCG 215, the example VDRCG 220, and the example current minors 225a-b based on certain ones of the example switches 205a-b that are open or closed.

The example CCG 210 generates a current of constant magnitude and positive or negative polarity. In examples disclosed herein, the example CCG 210 may be implemented by any type(s) of current source(s), circuit(s), and/or integrated circuit(s). In examples disclosed herein, the example CCG 210 may generate an example constant reference current $I_{REF,C}$ 235 upon reception of a signal. The example constant reference current $I_{REF,C}$ 235 is a current of constant magnitude and positive or negative polarity. In some examples, a received signal may trigger the example CCG 210 to generate the example constant reference current $I_{REF,C}$ 235. In examples disclosed herein, the example CCG 210 may generate the example constant reference current $I_{REF,C}$ 235 based on reception of the signal from a logic controller such as, for example, a CPU.

In examples disclosed herein, the example CCG 210 may generate the example constant reference current $I_{REF,C}$ 235 when the example switch 205b closes. The example CCG 210 supplies or sources the example constant reference current $I_{REF,C}$ 235 to or from the example current minor 225a. Alternatively, the example CCG 210 does not generate the example constant reference current $I_{REF,C}$ 235 when the example switch 205b is open. In other examples, the example CCG 210 does not generate the example constant reference current $I_{REF,C}$ 235 based on reception of a signal.

The example TDRCG 215 generates a current that tracks changes in temperature across one or more of the example bit cells 120. In examples disclosed herein, the example TDRCG 215 generates an example temperature dependent reference current $I_{REF,T}$ 240. The example temperature dependent reference current $I_{REF,T}$ 240 varies in magnitude and/or polarity based on changes in bit cell temperature over time. In some examples, the example TDRCG 215 may generate the example temperature dependent reference current $I_{REF,T}$ 240 upon reception of a signal. In some examples, the received signal may trigger the example TDRCG 215 to generate the example temperature dependent reference current $I_{REF,T}$ 240. In examples disclosed herein, the example TDRCG 215 may generate the example temperature dependent reference current $I_{REF,T}$ 240 based on reception of the signal from a logic controller such as, for example, a CPU. The example TDRCG 215 may be implemented by the example circuitry illustrated in FIG. 4, described in detail in the description of FIG. 4. However, any other type(s) of circuitry, device, and/or integrated circuit(s) may be used to implement the example TDRCG 215.

In examples disclosed herein, the example TDRCG 215 generates the example temperature dependent reference current $I_{REF,T}$ 240 when the example switch 205b closes. The example TDRCG 210 supplies or sources the example temperature dependent reference current $I_{REF,T}$ 240 to or from the example current minor 225a. Alternatively, the example TDRCG 215 does not generate the example temperature dependent reference current $I_{REF,T}$ 240 when the example switch 205b is open. In other examples, the example TDRCG 215 does not generate the example temperature dependent reference current $I_{REF,T}$ 240 based on reception of a signal. In examples disclosed herein, the example TDRCG 215 trims the example temperature dependent reference current $I_{REF,T}$ 240 to track or match the example bit cell current $I_{BIT}$ 130.

The example VDRCG 220 generates a current that tracks changes in voltage across one or more of the example bit cells 120. In examples disclosed herein, the example VDRCG 220 generates an example voltage dependent reference current $I_{REF,V}$ 245. The example voltage dependent reference current $I_{REF,V}$ 245 varies in magnitude and/or polarity based on changes in bit cell voltage over time. In some examples, the example VDRCG 220 may generate the example voltage dependent reference current $I_{REF,V}$ 245 upon reception of a signal. In some examples, the received signal may trigger the example VDRCG 220 to generate the example voltage dependent reference current $I_{REF,V}$ 245. In examples disclosed herein, the example VDRCG 215 may generate the example voltage dependent reference current $I_{REF,V}$ 245 based on reception of the signal from a logic controller such as, for example, a CPU. The example VDRCG 215 may be implemented by the example circuitry illustrated in FIG. 5, described in detail in the description of FIG. 5. However, any type(s) of circuitry, device, and/or integrated circuit(s) may be used to implement the example VDRCG 220.

In examples disclosed herein, the example VDRCG 220 generates the example voltage dependent reference current $I_{REF,V}$ 245 when the example switch 205b closes. The example VDRCG 220 supplies, or sources, the example voltage dependent reference current $I_{REF,V}$ 245 to, or from, the example current minor 225a. Alternatively, the example VDRCG 220 does not generate the example voltage dependent reference current $I_{REF,V}$ 245 when the example switch 205b is open. In other examples, the example VDRCG 220 does not generate the example voltage dependent reference current $I_{REF,V}$ 245 based on reception of a signal. In examples disclosed herein, the example VDRCG 220 may trim the example voltage dependent reference current $I_{REF,V}$ 245 to track or match the example bit cell current $I_{BIT}$ 130.

In examples disclosed herein, signals provided by a logic controller such as, for example, a CPU to ones of the components of the example reference current generator 115 (e.g., the example programmable current mirror(s) 201, the example switches 205a-b, the example CCG 210, the example TDRCG 215, and/or the example VDRCG 220) may serve to enable or disable operation(s) of respective ones of the components of the example reference current generator 115. For example, a signal provided to the example CCG 210 may prevent, or disable, the example CCG 210 from generating the example constant reference current $I_{REF,C}$ 235. Additionally or alternatively, a signal provided to the example VDRCG 220 may permit or enable the example VDRCG 220 to generate the example voltage dependent reference current $I_{REF,V}$ 245. Likewise, signals provided to ones of the example switches 205a-b may open or close ones of the example switches 205a-b to support operation of the example reference current generator 115.

The example current mirrors 225a-b are circuits, devices, and/or integrated circuits that copy or minor current from one component of the example reference current generator 115 to another. As used herein, copying current, or mirroring current, refers to replicating current from one active device to another. The example current mirrors 225a-b may receive an input current and output a current identical in polarity and/or magnitude to the input current. In examples disclosed herein, the example current minors 225a-b include transistors 250a-d coupled at gate terminals (e.g., transistor 250a coupled to transistor 250b, transistor 250c coupled to transistor 250d). In examples disclosed herein, the example transistors 250a-d are n-channel, CMOS transistors. In some examples, the example current mirror 225b may be implemented by an n-channel diode. However, the example current mirrors 225a-b may alternatively be implemented by p-channel transistors and/or any type(s) of transistor(s) or substrate(s) arranged in any design or fashion. Additionally, the example transistors 250a-d may be implemented using p-channel substrates and/or any type(s) of transistor(s) such as MOSFET transistors, SONOS transistors, drain extended n-channel metal-oxide semiconductor (DENMOS) transistors, drain extended p-channel metal-oxide semiconductor (DEPMOS) transistors, etc. The example current mirror 225b may also be implemented by a p-channel diode.

In examples disclosed herein, ones of the example constant reference current $I_{REF,C}$ 235, the example temperature dependent reference current $I_{REF,T}$ 240, and the example voltage dependent reference current $I_{REF,V}$ 245 are delivered to or sourced from the example current mirror 225a when the example switch 205b closes. The magnitudes, or values, of currents $I_{REF,C}$ 235, $I_{REF,T}$ 240, and $I_{REF,V}$ 245 may be generated by ones of the example CCG 210, the example TDRCG 215, and the example VDRCG 220, respectively, in any manner or fashion such as, for example, based on a set(s) of linear equations, etc. For example, the example CCG 210, the example TDRCG 215, and the VDRCG 220 may generate currents $I_{REF,C}$ 235, $I_{REF,T}$ 240, and $I_{REF,V}$ 245, respectively, at varying magnitudes and/or polarities to accurately track or match the example bit cell current $I_{BIT}$ 130. The magnitudes or values of ones of the example constant reference current $I_{REF,C}$ 235, the example temperature dependent reference current $I_{REF,T}$ 240, and the example voltage dependent reference current $I_{REF,V}$ 245 are summed, combined, or added together at a drain terminal of the example transistor 250a. The example current minor 225a copies, or minors a current (e.g., ones of the currents $I_{REF,C}$ 235, $I_{REF,T}$ 240, and $I_{REF,V}$ 245) provided to or sourced from the drain terminal of the example transistor 250a to match, or to equal, a current at a drain terminal of the example transistor 250b referred to herein as an example voltage/temperature dependent reference current $I_{REF(V,T)}$ 255. In some examples, the example voltage/temperature dependent reference current $I_{REF(V,T)}$ 255 may be equal to a sum or a combination of the example currents 235-245, a sum or a combination of the example currents 235-240, the example current 245, or the example current 240. In examples disclosed herein, the example voltage/temperature dependent reference current $I_{REF(V,T)}$ 255 is indicative of, and tracks, changes across bit cell temperature and voltage.

In some examples, when the example switch 205b closes, the example CCG 210, the example TDRCG 215, and/or the example VDRCG 220 receive a signal (e.g., from a CPU) enabling or disabling generation of the example constant reference current $I_{REF,C}$ 235, the example temperature dependent reference current $I_{REF,T}$ 240, and/or the example voltage dependent reference current $I_{REF,V}$ 245. In some examples, the example temperature dependent reference current $I_{REF,T}$ 240 is delivered to or sourced from the drain terminal of the example transistor 250a and copied to the example transistor 250b as the example current $I_{REF(V,T)}$ 255. In the aforementioned example, the current $I_{REF(V,T)}$ 255 copied to the example transistor 250b of the example current minor 225a is equivalent in magnitude or value and/or polarity to the example temperature dependent reference current $I_{REF,T}$ 240 and is only indicative of, and tracks, changes across bit cell temperature. In other examples, the example temperature dependent reference current $I_{REF,T}$ 240 and the example constant reference current $I_{REF,C}$ 235 are summed (e.g., resulting in example current $I_{REF(V,T)}$ 255) at the drain terminal of the example transistor 250a and copied to the example transistor 250b. The current $I_{REF(V,T)}$ 255 copied or mirrored at the example transistor 250b of the example current mirror 225a is equivalent in magnitude or value to the example temperature dependent reference current $I_{REF,T}$ 240 and the example constant reference current $I_{REF,C}$ 235 and is only indicative of, and tracks, changes across bit cell temperature.

In some examples, the magnitude or value of the example voltage dependent reference current $I_{REF,V}$ 245 is delivered to or sourced from the drain terminal of the example transistor 250a and copied to the example transistor 250b. In the aforementioned example, the current $I_{REF(V,T)}$ 255 copied, or mirrored, at the example transistor 250b of the example current mirror 225a is equivalent in magnitude or value to the example voltage dependent reference current $I_{REF,V}$ 245 and is only indicative of, and tracks, changes across bit cell voltage.

The example programmable current mirror(s) 201 is a circuit(s), a device(s), and/or an integrated circuit(s) configured to trim current and to copy current. The example programmable current mirror(s) 201 copies or mirrors a current, trims the current, and outputs a current identical or different in polarity and/or magnitude to the trimmed current. However, in some examples, the example programmable current mirror(s) 201 does not trim current. Although the example programmable current mirror(s) 201 is illustrated as a single block in the example illustration of FIG. 1, any number of programmable current minors 201 may exist in the example reference current generator 115. The example programmable current mirror(s) 201 may include a plurality of transistors and/or devices capable of receiving signals from a logic controller such as, for example, a CPU. The transistors included in the example programmable current mirror(s) 201 may receive signals and subsequently be activated, or selected, to trim a quantity of current. In examples disclosed herein, the example programmable current mirror(s) 201 is implemented using programmable p-channel current minors as depicted in the illustrated example of FIG. 3, described in detail in the description of FIG. 3.

In the illustrated example of FIG. 2, the example programmable current mirror(s) 201 receives an example trim enable signal (EN) 260. The example programmable current mirror(s) 201 may receive the example EN signal 260 and subsequently trim the example reference current $I_{REF}$ 135. The example programmable current mirror(s) 201 may receive the EN signal 260 from a logic controller such as, for example, a CPU.

In examples disclosed herein, the example programmable current mirror(s) 201 copies or mirrors an example input current $I_{IN}$ 265 to the example current minor 225b. In examples disclosed herein, the example input current $I_{IN}$ 265 varies in magnitude based on whether ones of the example switches 205a-b are opened or closed. In examples disclosed herein, the example input current $I_{IN}$ 265 varies in magnitude based on whether ones of the example CCG 210, the example TDRCG 215, and the example VDRCG 220 are generating ones of the example currents 235-245. In examples disclosed herein, the example programmable current mirror(s) 201 copies or mirrors the example input current $I_{IN}$ 265 to the example current mirror 225b as the example reference current $I_{REF}$ 135. In some examples, the example programmable current mirror(s) 201 may copy or mirror the example input current $I_{IN}$ 265 to the example current minor 225b as the example reference current $I_{REF}$ 135, wherein a magnitude of the example input current $I_{IN}$ 265 is equal to a magnitude of the example reference current $I_{REF}$ 135. In other examples, the example programmable current mirror(s) 201 may copy the example input current $I_{IN}$ 265 and trim the resultant example reference current $I_{REF}$ 135 delivered to or sourced from the example current minor 225b. In such examples, the example reference current $I_{REF}$ 135 is trimmed to track or match the example bit cell current $I_{BIT}$ 130. In examples disclosed herein, a logic controller such as, for example, a CPU may provide the example EN signal 260 to the example programmable current mirror(s) 201 when the example input current $I_{IN}$ 265 is greater than or less than the example bit cell current $I_{BIT}$ 130. In such examples, the programmable current mirror(s) 201 performs trimming operations and delivers the example reference current $I_{REF}$ 135 to, or sources the example reference current $I_{REF}$ 135 from, the example current mirror 225b at a magnitude that tracks or matches the example bit cell current $I_{BIT}$ 130.

In examples disclosed herein, a magnitude of the example input current $I_{IN}$ 265 varies based on a type(s) of operation(s) and/or mode(s) detected by the example reference current generator 115. In examples disclosed herein, signals such as, for example, enable and disable signals, may be received by ones of the example CCG 210, the example TDRCG 215, and/or the example VDRCG 220 from a logic controller (e.g., a CPU) to facilitate appropriate operation and execution of the example reference current generator 115. Additionally, signals may be received by ones of the example switches 205a-b to open or close ones of the example switches 205a-b. Certain ones of the example switches 205a-b that are open or closed facilitate appropriate operation and execution of the example reference current generator 115. A magnitude of the example input current $I_{IN}$ 265 varies based on certain ones of the example switches 205a-b that are open or closed. As such, a magnitude of the example reference current $I_{REF}$ 135 varies based on certain ones of the example switches 205a-b that are open or closed. In examples disclosed herein, the example reference current generator 115 facilitates generation of the example reference current $I_{REF}$ 135 based on a determination of (i) a read, a write, or a program-verify operation, or mode(s), and (ii) an erase or an erase-verify operation, or mode(s).

In examples disclosed herein, the example reference current generator 115 detects and responds to read, write, and program-verify operations. In response to a read, a write, or a program-verify operation, ones of the example switches 205a-b receive enable and disable signals. In examples disclosed herein, the example switch 205a receives an enable signal and subsequently closes whereas the example switch 205b receives a disable signal and remains open. Closing the example switch 205a establishes a conductive path from the example current source 200a to the example programmable current mirror(s) 201. To that end, the example current source 200a sources current from the example programmable current mirror(s) 201. The example current source 200a sources the example supply current $I_{SUPPLY}$ 200b from the example programmable current mirror(s) 201 such that the example input current $I_{IN}$ 265 is equal to the example supply current $I_{SUPPLY}$ 200b. As a result, the example programmable current mirror(s) 201 minors or copies the example input current $I_{IN}$ 265 (e.g., at a magnitude equal to the example supply current $I_{SUPPLY}$ 200b) to the example current mirror 225b. In some examples, the example programmable current mirror(s) 201 trims the example input current $I_{IN}$ 265 to increase or decrease a magnitude of the example reference current $I_{REF}$ 135 to appropriately track, or match, the example bit cell current $I_{BIT}$ 130.

In response to a read, a write, or a program-verify operation, none of the example CCG 210, the example TDRCG 215, and the example VDRCG 220 source current from the example programmable current mirror(s) 201 due to the open circuit resulting from switch 205b being open. When the example switch 205b is open, the example CCG 210, the example TDRCG 215, and the example VDRCG 220 do not generate any ones of the example currents $I_{REF,C}$ 235, $I_{REF,T}$ 240, and $I_{REF,V}$ 245, respectively. In some examples, the example CCG 210, the example TDRCG 215, and the example VDRCG 220 receive signals to disable generation of the example currents $I_{REF,C}$ 235, $I_{REF,T}$ 240, and $I_{REF,V}$ 245, respectively, when the example switch 205b is open. In this manner, currents 235-245 are not generated and sourced from the example programmable current mirror(s) 201 in response to a read, a write, or a program-verify operation. To that end, the magnitude of the example input current $I_{IN}$ 265 sourced from the example programmable current mirror(s) 201 is equal to the example supply current $I_{SUPPLY}$ 200b. In examples disclosed herein, the example reference current $I_{REF}$ 135 generated by the example reference current generator 115 does not track the example bit cell current $I_{BIT}$ 130 across voltage and temperature in response to a read, a write, or a program-verify operation.

In examples disclosed herein, the example reference current generator 115 detects and responds to erase operations and/or erase-verify operations. In response to an erase operation and/or an erase-verify operation, the example switches 205a-b receive enable signals. In examples disclosed herein, the example switches 205a-b receive enable signals and subsequently close. Closing the example switch 205b establishes a conductive path from the example programmable current mirror(s) 201 to the example current mirror 225a. Additionally, closing the example switch 205b establishes a conductive path from the example programmable current mirror(s) 201 to the example CCG 210, the example TDRCG 215, and the example VDRCG 220. As a result, the example CCG 210, the example TDRCG 215, and the example VDRCG 220 are capable of generating, and sourcing from the example programmable current mirror(s) 201, any ones of the example currents $I_{REF,C}$ 235, $I_{REF,T}$ 240, or $I_{REF,V}$ 245, respectively. As such, ones of the example CCG 210, the example TDRCG 215, and the example VDRCG 220 generate ones of the example currents $I_{REF,C}$ 235, $I_{REF,T}$ 240, and $I_{REF,V}$ 245, respectively, thereby sourcing current from the example programmable current mirror(s) 201 via the example current minor 225a. In this manner, ones of the currents 235-245 are generated and sourced from the example programmable current mirror(s) 201 in response to an erase operation and/or an erase-verify operation. A magnitude of the example input current $I_{IN}$ 265 varies based on ones of the example CCG 210, the example TDRG 215, and the example VDRCG 220 sourcing the example currents $I_{REF,C}$ 235, $I_{REF,T}$ 240, and $I_{REF,V}$ 245, respectively, from the example programmable current mirror(s) 201. As a result, a magnitude of the example reference current $I_{REF}$ 135 varies and tracks or matches changes across voltage and/or temperature.

In examples disclosed herein, ones of the example CCG 210, the example TDRCG 215, and the example VDRCG 220 may generate ones of the example currents $I_{REF,C}$ 235, $I_{REF,T}$ 240, and $I_{REF,V}$ 245, respectively, subsequent to receiving an enable signal from a logic controller (e.g., a CPU). Ones of the example CCG 210, the example TDRCG 215, and the example VDRCG 220 may receive an enable signal in response to an erase operation or an erase-verify operation and the example switch 205b closing. Ones of the example CCG 210, the example TDRCG 215, and the example VDRCG 220 may generate ones of the example currents $I_{REF,C}$ 235, $I_{REF,T}$ 240, and $I_{REF,V}$ 245, respectively, and deliver, or source, ones of the example currents $I_{REF,C}$ 235, $I_{REF,T}$ 240, and $I_{REF,V}$ 245 to, or from, the example current minor 225a, as illustrated in FIG. 2. The example current mirror 225a copies or mirrors a current (e.g., ones of the example currents $I_{REF,C}$ 235, $I_{REF,T}$ 240, and $I_{REF,V}$ 245) at the drain terminal of the example transistor 250a to the drain terminal of the example transistor 250b (e.g., the example current $I_{REF(V,T)}$ 255). As a result, the example input current $I_{IN}$ 265 at the programmable current mirror(s) 201 is at least equal, but not less than, the example current $I_{REF(V,T)}$ 255. The example input current $I_{IN}$ 265 is copied or mirrored via the example programmable current mirror(s) 201 as the example reference current $I_{REF}$ 135. In response to an erase operation and/or an erase-verify operation, the example reference current generator 115 tracks or matches the example bit cell current $I_{BIT}$ 130 across temperature and voltage by sourcing a current at least equivalent to, but not less than, ones of the example currents $I_{REF,C}$ 235, $I_{REF,T}$ 240, and $I_{REF,V}$ 245 from the example programmable current mirror(s) 201.

Additionally, in response to an erase operation(s) and/or an erase-verify operation(s), the example switch 205a closes. Closing the example switch 205a establishes a conductive path from the example programmable current mirror(s) 201 to the example current source 200a. To that end, the example current source 200a sources current from the example programmable current mirror(s) 201. The example current source 200a sources the example supply current $I_{SUPPLY}$ 200b from the example programmable current mirror(s) 201 such that the example input current $I_{IN}$ 265 is equal to the example supply current $I_{SUPPLY}$ 200b plus ones of the example currents $I_{REF,C}$ 235, $I_{REF,T}$ 240, and $I_{REF,V}$ 245. In other words, during an erase operation and/or an erase-verify operation, the example current source 200a and ones of the example CCG 210, the example TDRCG 215, and the example VDRCG 220 source current from the example programmable current mirror(s) 201, thereby adjusting or modifying the example reference current $I_{REF}$ 135 to track or match changes in the example bit cell current $I_{BIT}$ 130 across voltage and/or temperature.

In some examples, the input current $I_{IN}$ 265 sourced by the example programmable current mirror(s) 201 during an erase and/or an erase-verify operation may be equivalent to the example supply current $I_{SUPPLY}$ 200b plus (i) a sum or a combination of currents 235-245, (ii) a sum or a combination of currents 235, 240, (iii) the example current $I_{REF,T}$ 240, or (iv) the example current $I_{REF,V}$ 245.

In response to an erase and/or an erase-verify operation, the example CCG 210, the example TDRCG 215, and the example VDRCG 220 may receive an enable signal from a logic controller (e.g., a CPU) that enables generation of currents 235-245. The example CCG 210, the example TDRCG 215, and the example VDRCG 220 may subsequently generate currents 235-245, respectively, upon reception of the enable signal and the example currents 235-245 are summed and copied as the example current $I_{REF(V,T)}$ 255 via the example current mirror 225a. In examples disclosed herein, the example current $I_{REF(V,T)}$ 255 (e.g., a summed or a combined magnitude of currents 235-245) is sourced from the example programmable current mirror(s) 201 via a conductive path established by closed switch 205b. Additionally, the example supply current $I_{SUPPLY}$ 200b is sourced from the example programmable current mirror(s) 201 via a conductive path established by closed switch 205a. As a result of the example current source 200a, the example CCG 210, the example TDRCG 215, and the example VDRCG 220 sourcing the example currents 200b, 235-245, respectively, the example input current $I_{IN}$ 265 at the example programmable current mirror(s) 201 is equal to a summed magnitude of the example currents 200b, 235-245. In examples disclosed herein, the example reference current generator 115 may be configured to source currents 200b, 235-245 from the example programmable current mirror(s) 201, during a normal or default mode(s) of operation. The normal or default mode(s) enables each of the CCG 210, the TDRCG 215, and the VDRCG 220 and results in generation of currents 235-245 and sourcing of currents 200b, 235-245.

In some examples, in response to an erase and/or an erase-verify operation, the example CCG 210 and the example TDRCG 215 may receive an enable signal whereas the example VDRCG 220 may receive a disable signal, from a logic controller (e.g., a CPU). In such examples, generation of currents $I_{REF,C}$ 235 and $I_{REF,T}$ 240 are initiated whereas generation of current $I_{REF,V}$ 245 is not. The example CCG 210 and the example TDRCG 215 may subsequently generate currents $I_{REF,C}$ 235 and $I_{REF,T}$ 240, respectively, upon reception of the enable signal and sum and copy or mirror the example currents 235, 240 as the example current $I_{REF(V,T)}$ 255 via the example current mirror 225a. In examples disclosed herein, the example current $I_{REF(V,T)}$ 255 (e.g., a summed magnitude of currents 235, 240) is sourced from the example programmable current mirror(s) 201 via a conductive path established by closed switch 205b. Additionally, the example supply current $I_{SUPPLY}$ 200b is sourced from the example programmable current mirror(s) 201 via a conductive path established by closed switch 205a. As a result of the example current source 200a, the example CCG 210, and the example TDRCG 215 sourcing the example currents 200b, 235-240, respectively, the example input current $I_{PV}$ 265 at the example programmable current mirror(s) 201 is equal to a summed magnitude of the example currents 200b, 235-240. In examples disclosed herein, the example reference current generator 115 may be configured to source the example currents 235, 240 from the example programmable current mirror(s) 201 during a legacy mode(s) of operation. The legacy mode(s) may be initiated by an end user(s) or a logic controller (e.g., a CPU) to sacrifice features or performances of the example reference current generator 115. During the legacy mode(s), the VDRCG 220 is disabled and the voltage dependent reference current $I_{REF,V}$ 245 is not generated, as is described in the aforementioned example.

In other examples, in response to an erase and/or an erase-verify operation, the example TDRCG 215 may receive an enable signal, whereas the example CCG 210 and the example VDRCG 220 may receive a disable signal, from a logic controller (e.g., a CPU). In such examples, generation of current $I_{REF,T}$ 240 is initiated whereas generation of currents 235, 245 are not. The example TDRCG 215 may subsequently generate current $I_{REF,T}$ 240 upon reception of the enable signal and copy, or mirror, the example current $I_{REF,T}$ 240 via the example current mirror 225a. In examples disclosed herein, the example current $I_{REF(V,T)}$ 255 (e.g., equal to current $I_{REF,T}$ 240) is sourced from the example programmable current mirror(s) 201 via a conductive path established by closed switch 205b. Additionally, the example supply current $I_{SUPPLY}$ 200b is sourced from the example programmable current mirror(s) 201 via a conductive path established by closed switch 205a. As a result of the example current source 200a and the example TDRCG 215 sourcing the example currents 200b, 240, respectively, the example input current $I_{IN}$ 265 at the example programmable current mirror(s) 201 is equal to a summed magnitude of the example currents 200b, 240. In examples disclosed herein, the example reference current generator 115 may be configured to source the example currents 200b, 240 from the example programmable current mirror(s) 201 during a temperature dependent reference current $I_{REF,T}$ 240 trim testing mode(s), referred to herein as a temperature test mode(s). The temperature test mode(s) may be initiated by an end user or a logic controller (e.g., a CPU) to measure a trimming performance (e.g., a quantity of micro-amps of trimmed current) of the example TDRCG 215. During the temperature test mode(s), the CCG 210 and the VDRCG 220 are disabled and currents 235, 245 are not generated, as is described in the aforementioned example.

In some examples, in response to an erase and/or an erase-verify operation, the example VDRCG 220 may receive an enable signal, whereas the example CCG 210 and the example TDRCG 215 may receive a disable signal, from a logic controller (e.g., a CPU). In such examples, generation of current $I_{REF,V}$ 245 is initiated whereas generation of currents 235, 240 are not. The example VDRCG 220 may subsequently generate the current $I_{REF,V}$ 245 upon reception of the enable signal and copy or mirror the example reference current $I_{REF,V}$ 245 via the example current mirror 225a. In examples disclosed herein, the example current $I_{REF(V,T)}$ 255 (e.g., equal to current $I_{REF,V}$ 245) is sourced from the example programmable current mirror(s) 201 via a conductive path established by closed switch 205b. Additionally, the example supply current $I_{SUPPLY}$ 200b is sourced from the example programmable current mirror(s) 201 via a conductive path established by closed switch 205a. As a result of the example current source 200a and the example VDRCG 220 sourcing the example currents 200b, 245, respectively, the example input current $I_{IN}$ 265 at the example programmable current mirror(s) 201 is equal to a summed magnitude of the example currents 200b, 245. In examples disclosed herein, the example reference current generator 115 may be configured to source the example currents 200b, 245 from the example programmable current mirror(s) 201, during a voltage dependent reference current $I_{REF,V}$ 245 trim testing mode(s), referred to herein as a voltage test mode(s). The voltage test mode(s) may be initiated by an end user or a logic controller (e.g., a CPU) to measure a trimming performance of the example VDRCG 220. During the voltage test mode(s), the CCG 210 and the TDRCG 215 are disabled and currents 235, 240 are not generated, as is described in the aforementioned example.

The example programmable current mirror(s) 201 copies, or minors, the example input current $I_{IN}$ 265 (e.g., varying in magnitude and/or polarity based on a type(s) of operation(s) (e.g., read, write, program-verify, erase, and erase-verify) and/or a mode(s) (e.g., normal, or default mode(s), legacy mode(s), temperature test mode(s), voltage test mode(s)) and subsequently opens or closes a quantity of current mirrors to trim a quantity (e.g., milliamps, micro-amps, etc.) of the example input current $I_{IN}$ 265. In some examples, the example programmable current mirror(s) 201 receives signals from a logic controller (e.g., a CPU) establishing a ratio of conducting to non-conducting current mirrors. The ratio of conducting to non-conducting current minors establishes a quantity of current minors (e.g., included in the example programmable current mirror(s) 201) that conduct electricity. In some examples, when the ratio of conducting to non-conducting current minors is closer to unity (e.g., 1), the example programmable current mirror(s) 201 increases the magnitude of the example input current $I_{IN}$ 265. Alternatively, when the ratio of conducting to non-conducting current mirrors is closer to zero, the example programmable current mirror(s) 201 decreases the magnitude of the example input current $I_{IN}$ 265. The example input current $I_{IN}$ 265 is trimmed by the example programmable current mirror(s) 201 to further track or match the example bit cell current $I_{BIT}$ 130.

In examples disclosed herein, the trimmed input current $I_{IN}$ 265 is copied or mirrored through the example programmable current mirror(s) 201 thereby establishing a magnitude of the example reference current $I_{REF}$ 135 equal to the trimmed input current $I_{IN}$ 265. The example reference current $I_{REF}$ 135 is delivered to or sourced from the drain terminal of the example transistor 250c of the example current minor 225b and copied or mirrored to the example transistor 250d. The example current mirror 225b stabilizes the example reference current $I_{REF}$ 135 and ensures the magnitude of the example reference current $I_{REF}$ 135 does not fluctuate and/or oscillate. The example reference current $I_{REF}$ 135 is subsequently sensed or detected by the example sense amplifier 110 (FIG. 1). The sense amplifier subsequently compares the example reference current $I_{REF}$ 135 to the example bit cell current $I_{BIT}$ 130.

Figure 3:
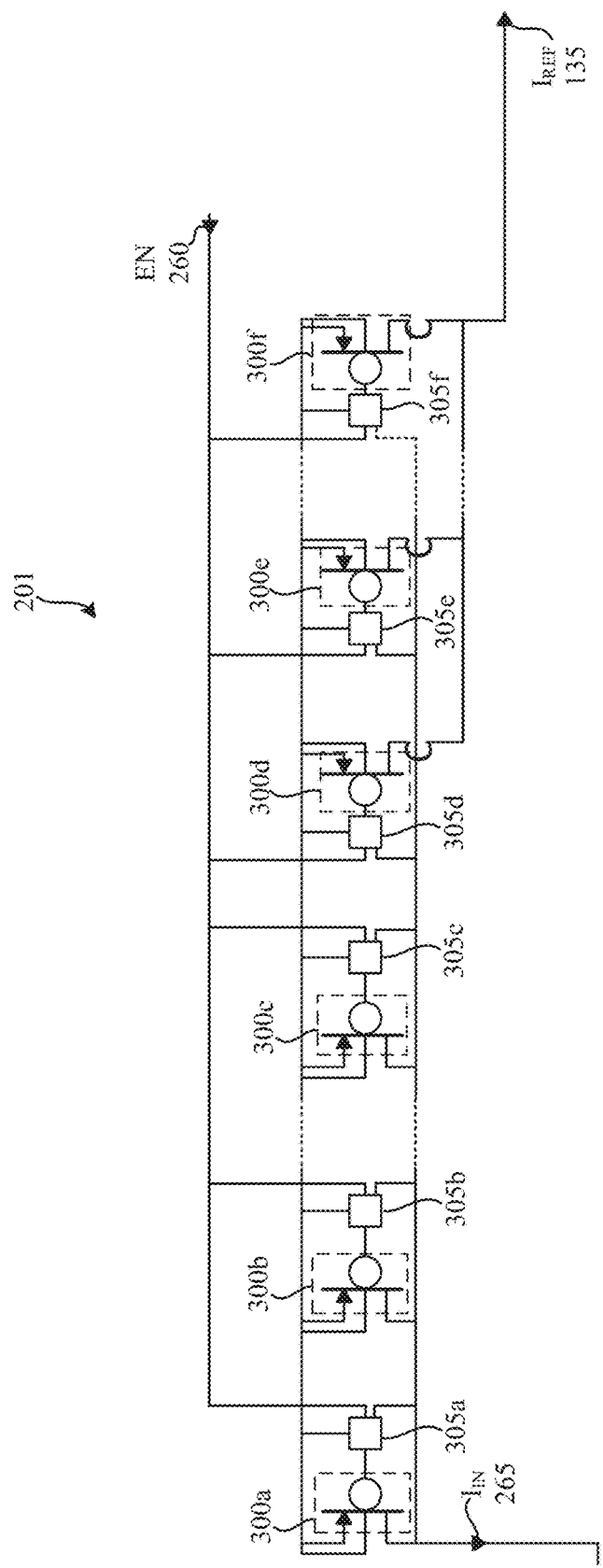
FIG. 3 is an illustration of an example programmable current mirror(s) of FIG. 2.

FIG. 3 depicts an example architecture of the example programmable current mirror(s) 201. The example programmable current mirror(s) 201 copies the example input current $I_{IN}$ 265 via an array, or collection, of transistors and/or devices. The example programmable current mirror(s) 201 also trims the input current $I_{IN}$ 265 to further track or match the bit cell current $I_{BIT}$ 130 and to copy or mirror a current (e.g., the example reference current $I_{REF}$ 135) to the example current mirror 225b of FIG. 2. The example programmable current mirror(s) 201 includes a plurality of example transistors 300a-f and example programmable latches 305a-f that trim and copy the example input current $I_{IN}$ 265.

The example programmable current mirror(s) 201 may be implemented by coupling a drain terminal of the example transistor 305a to a drain terminal of the example transistor 305b and to the example switches 205a-b. Additionally, a source and a base terminal of the example transistor 300a are coupled together and to a source and a base terminal of the example transistor 300b. The source and the base terminal of the example transistor 300b are also coupled together. Gate terminals of the example transistors 305a-b are coupled to the example programmable latches 305a-b, respectively. The example programmable latches 305a-b are also coupled to the source, the drain, and the base terminals of each of the example transistors 300a-b. In examples disclosed herein, the example transistor 300c may be coupled to the example transistor 300b in the same manner or fashion that the example transistor 300b is coupled to the example transistor 300a. It should be understood, however, that the example transistor 300c may be implemented by any number of transistors coupled in a fashion similar or identical to the manner wherein the example transistor 300b is coupled to the example transistor 300a (e.g., depicted via dotted lines connecting the example transistors 300b-c of FIG. 3). The example transistor 300c is also coupled to the example programmable latch 305c in the same manner or fashion that the example transistors 300a-b are coupled to the example programmable latches 305a-b. The example transistor 300c, and/or any number of transistors arranged in a fashion similar to the example transistors 300a-b thereof, are also coupled to the example transistor 300d. In some examples, the example transistor 300c does not exist in the example implementation of the example programmable current mirror(s) 201 and the example transistor 300b is coupled to the example transistor 300d.

The example programmable current mirror(s) 201 is further implemented by coupling the source and the base terminals of the example transistors 300a-c to source and base terminals of the example transistors 300d-e. Drain terminals of the example transistors 300d-e are coupled to the example current minor 225b. Gate terminals of the example transistors 300d-e are coupled to the example programmable latches 305d-e. The example programmable latches 305d-e are further coupled to the base and the source terminals of the example transistors 300a-e, the drain terminals of the example transistors 305a-c, and the programmable latches 305a-c. In examples disclosed herein, the example transistor 300f may be coupled to the example transistor 300d in the same manner or fashion that the example transistor 300e is coupled to the example transistor 300d. It should be understood, however, that the example transistor 300f may be implemented by any number of transistors coupled in a fashion similar or identical to the manner wherein the example transistor 300e is coupled to the example transistor 300d (e.g., depicted via the dotted lines connecting the example transistors 300b-c of FIG. 3). The example transistor 300f is also coupled to the example programmable latch 305f in the same manner or fashion that the example transistors 300d-e are coupled to the example programmable latches 305d-e. The example transistor 300f, and/or any number of transistors arranged in a fashion similar to the example transistors 300d-e thereof, are also coupled to the example current minor 225b at a drain terminal(s). In some examples, the example transistor 300f does not exist in the implementation of the example programmable current mirror(s) 201.

In examples disclosed herein, the example transistors 300a-f used to implement the example programmable current mirror(s) 201 are p-channel transistors. In the illustrated example, the example transistors 300a-f are p-channel metal-oxide semiconductor (PMOS) transistors. However, the example transistors 300a-f may be implemented using positive-negative-positive (PNP) bi-polar junction transistors (BJTs) and/or any other type(s) of p-channel device(s). Additionally or alternatively, the example transistors 300a-f used to implement the example programmable current mirror(s) 201 may be n-channel transistors and include a plurality of n-channel metal-oxide semiconductor (NMOS) transistors, negative-positive-negative (NPN) BJTs, and/or any other type(s) of n-channel device(s). The example transistors 300a-f used to implement the example programmable current mirror(s) 201 may include a combination of p-channel and n-channel transistors. The example transistors 300a-f copy current to ones of a different transistor 305a-f in the example programmable current mirror(s) 201. Additionally, the example transistors 300a-f trim current based on operation of the example programmable latches 305a-f.

In examples disclosed herein, the example programmable latches 305a-f used to implement the example programmable current mirror(s) 201 are multiplexors. However, the example programmable latches 305a-f may alternatively be bi-stable multi-vibrators such as, for example, J-K flip flop, S-R flip flops, D flip flops, etc. The example programmable latches 305a-f may be implemented by any type(s) and/or combination of latches and/or logic devices. In examples disclosed herein, the example programmable latches 305a-f may receive input signals and retain an output state until reception of different input signals. In the illustrated example of FIG. 3, the example programmable latches 305a-f may receive a signal(s) and activate or select ones of the example transistors 300a-f to conduct.

In the illustrated example of FIG. 3, the example programmable latches 305a-f receive the example EN signal 260 (FIG. 2) from a logic controller such as, for example, a CPU. It should be understood, however, that each of the example programmable latches 305a-f may receive a different signal(s). As such, it should be understood that the example EN signal 260 may include or represent a plurality of different signals configured to be delivered to and select each of the example programmable latches 305a-f. The example EN signal 260 activates or selects certain ones, or quantities, of the example programmable latches 305a-f. In some examples, based on strength, intensity, frequency, etc. of the example EN signal 260, certain ones or quantities of the example programmable latches 305a-f activate or select certain ones of the example transistors 300a-f to conduct. In examples disclosed herein, the EN signal 260 establishes a ratio of conducting to non-conducting current minors. For example, the EN signal 260 may cause the example programmable latches 305a-f to activate or to select certain ones of the example transistors 300a-f to conduct or not conduct. Based on the ratio of conducting to non-conducting current mirrors, current supplied to or sourced from the example programmable current mirror(s) 201 is increased or decreased. The example input current $I_{IN}$ 265 is trimmed to a magnitude that tracks or matches the magnitude of the example bit cell current $I_{BIT}$ 130 by certain ones of the example transistors 300a-f amplifying or attenuating the example input current $I_{IN}$ 265. The resultant magnitude of the input current $I_{IN}$ 265 is the example reference current $I_{REF}$ 135. The example reference current $I_{REF}$ 135 is subsequently copied or mirrored to the example current minor 225b.

Figure 4:
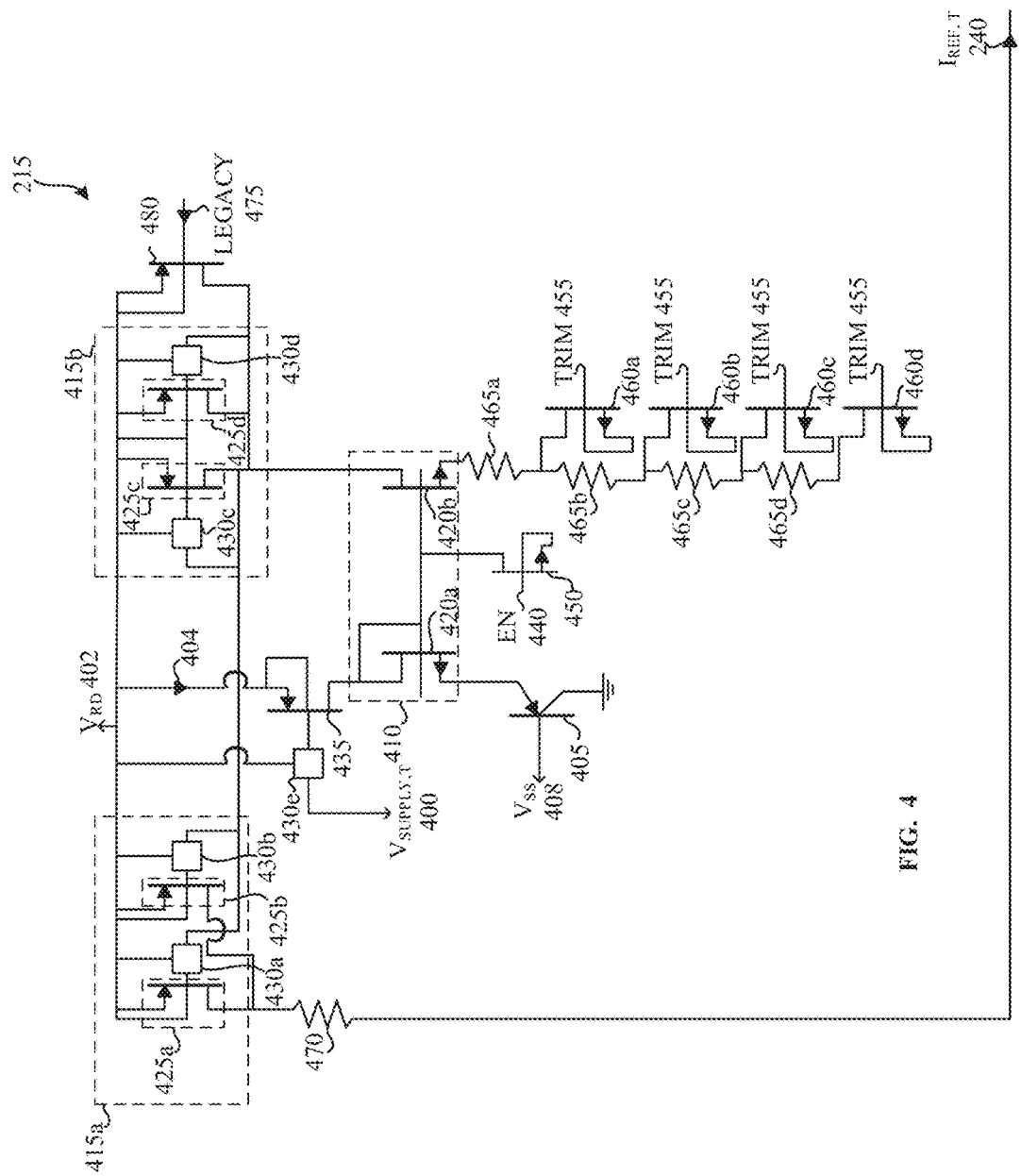
FIG. 4 is an illustration of an example temperature dependent reference current generator of FIG. 2.

FIG. 4 depicts an example architecture of the example TDRCG 215 (FIG. 2). The example TDRCG 215 generates a current that tracks changes in temperature across one or more of the example bit cells 120. In the illustrated example of FIG. 4, the example TDRCG 215 is supplied an example supply voltage $V_{SUPPLY,T}$ 400 and an example read voltage $V_{RD}$ 402. Applying the example supply voltage $V_{SUPPLY,T}$ 400 and the example read voltage $V_{RD}$ 402 induces an example current 404, illustrated in FIG. 4. The example TDRCG 215 includes a temperature dependent device 405, an example voltage mirror 410, and example current mirrors 415a-b.

The example supply voltage $V_{SUPPLY,T}$ 400 is a voltage of constant magnitude. In examples disclosed herein, the example supply voltage $V_{SUPPLY,T}$ 400 may be a voltage of positive or negative polarity. The example supply voltage $V_{SUPPLY,T}$ 400 may be generated by any type(s) of current source(s) and/or current mirror(s) implemented by any type(s) of circuit(s), transistor(s), etc. Also, the example supply voltage $V_{SUPPLY,T}$ 400 may exhibit any magnitude or value. In some examples, the example supply voltage $V_{SUPPLY,T}$ 400 may be generated and/or supplied to the example TDRCG 215 from a current source(s) and/or a current mirror(s) outside of the example TDRCG 215.

The example temperature dependent device 405 generates a temperature dependent voltage. In examples disclosed herein, the example temperature dependent device 405 is a PNP BJT. However, the example temperature dependent device 405 may alternatively be implemented using any type(s) of transistor(s) and/or temperature dependent transistor(s). In some examples, the temperature dependent device 405 may be a temperature dependent CMOS transistor configured as a diode. The example temperature dependent device 405 is provided an example reference voltage $V_{SS}$ 408. In examples disclosed herein, the PNP BJT generates a temperature dependent voltage as a result of impedance variations at various temperatures. The example temperature dependent device 405 (e.g., the PNP BJT) generates varying magnitudes of the temperature dependent voltage based on temperature dependent characteristics of a base and an emitter terminal (e.g., emitter efficiency, base transport, etc.). In examples disclosed herein, a magnitude of the temperature dependent voltage generated by the example temperature dependent device 405 may decrease as temperature increases. Alternatively, in some examples, the magnitude of the temperature dependent voltage generated by the example temperature dependent device 405 may increase as temperature increases. In examples disclosed herein, the example temperature dependent device 405 generates the temperature dependent voltage using the example supply voltage $V_{SUPPLY,T}$ 400 and the example reference voltage $V_{SS}$ 408.

The example voltage minor 410 is a circuit, device, and/or integrated circuit(s) to copy a temperature dependent voltage generated by the example temperature dependent device 405. In example disclosed herein, the example voltage mirror 410 is constructed similar or identical to the example current minors 225a-b of FIG. 2. The example voltage minor 410 is implemented by example transistors 420a-b. In examples disclosed herein, the example transistors 420a-b are similar or identical to the example transistors 250a-d of FIG. 2 and may be an n-channel and/or p-channel transistor.

In some examples, the example voltage mirror 410 may be implemented by an n-channel or a p-channel diode.

The example current mirrors 415a-b are circuits, devices, and/or integrated circuits that copy a temperature dependent current, generated as a result of the temperature dependent voltage generated by the example temperature dependent device 405, and that trim the temperature dependent current in response to initiation of the legacy mode(s). The example current minors 415a-b include example transistors 425a-d and example programmable latches 430a-e.

The example current mirror 415a may be implemented by coupling a base and a source terminal of the example transistor 425a to a base and a source terminal of the example transistor 425b. The example current mirror 415a is also implemented by coupling each of the base and the source terminals of the example transistors 425a-b to base and source terminals of the example transistors 425c-d. In examples disclosed herein, the example read voltage $V_{RD}$ 402 is supplied to the base and the source terminals of the example transistors 425a-d. The example current mirror 415a may also be implemented by coupling a drain terminal of the example transistor 425a to a drain terminal of the example transistor 425b. Alternatively, the example current minor 415b may be implemented by coupling the base terminals of the example transistor 425c and the example transistor 425d. The example current mirror 415b is also implemented by coupling the base and the source terminal of the example transistor 425c to the base and the source terminal of the example transistor 425d. The example current minor 415b may be implemented by coupling a drain terminal of the example transistor 425c to a drain terminal of the example transistor 425d. The drain terminals of the example transistors 425c-d are coupled to a drain terminal of the example transistor 420b of the example voltage mirror 410 and the example latches 430a-d. Additionally, each of the example programmable latches 430a-e are provided the example read voltage $V_{RD}$ 402. However, the example current mirrors 415a-b may include transistors 425a-d connected or coupled in any other fashion.

The example transistors 425a-d used to implement the example current minors 415a-b are similar or identical to the example transistors 300a-f of FIG. 3. In example disclosed herein, the example transistors 425a-d may be n-channel and/or p-channel transistors. The example transistors 425a-d copy or minor current to ones of different transistors 425a-d of the example current minors 415a-b. Additionally, when a legacy mode(s) is initiated, the example transistors 425a-d trim the temperature dependent reference current $I_{REF,T}$ 240 based on operation of the example programmable latches 430a-e.

The example programmable latches 430a-e used to implement the example current mirrors 415a-b are similar or identical to the example programmable latches 305a-f of FIG. 3. In examples disclosed herein, the example programmable latches 430a-e are multiplexors. However, the example programmable latches 430a-e may alternatively be implemented by bi-stable multi-vibrators such as, for example, J-K flip flops, S-R flip flops, D-flip flops, etc. The example programmable latches 430a-e may be implemented by any type(s) and/or combination of latch(es) and/or logic device(s). In examples disclosed herein, the example programmable latches 430a-e may receive, from a logic controller (e.g., a CPU), input signals and retain an output state until reception of different input signals. In the illustrated example of FIG. 4, the example programmable latches 430a-e may receive a signal(s) and activate or select ones of the example transistors 425a-d to conduct.

In the illustrated example of FIG. 4, the example TDRCG 215 also includes an example transistor 435. In examples disclosed herein, the example transistor 435 is a p-channel transistor such as, for example, a PMOS transistor. However, the example transistor 435 may be an n-channel transistor and/or any other type(s) of transistor. The example transistor 435 receives the example current 404 in response to application of the example supply voltage $V_{SUPPLY,T}$ 400 and the example read voltage $V_{RD}$ 402. The example transistor 435 also supports operation of the example voltage mirror 410.

In example disclosed herein, a gate terminal of the example transistor 435 is coupled to the example programmable latch 430e. The example programmable latch 430e receives the example read voltage $V_{RD}$ 402. A source terminal of the example transistor 435 is coupled to a base terminal of the example transistor 435. A drain terminal of the example transistor 435 is coupled to a drain and a gate terminal of the example transistor 420a of the example voltage mirror 410. A source terminal of the example transistor 420a is coupled to an emitter terminal of the example temperature dependent device 405. In examples disclosed herein, a gate terminal of the example transistor 420b is coupled to the gate terminal and the drain terminal of the example transistor 420a and the drain terminal of the example transistor 435.

In some examples, the example TDRCG 215 may operate as follows. A logic controller such as, for example, a CPU may deliver an enable (EN) signal 440 to the example TDRCG 215 to initiate generation of the example temperature dependent reference current $I_{REF,T}$ 240. The example EN signal 440 may enable or disable a temperature dependent voltage, generated by the example temperature dependent device 405, to be copied or mirrored via the example voltage minor 410. In some examples, if the TDRCG 215 does not receive the example EN signal 440, the TDRCG 215 does not initiate generation of the example temperature dependent reference current $I_{REF,T}$ 240. In some examples, when the TDRCG 215 does not receive the example EN signal 440, an example transistor 450 may remain grounded and prevent the temperature dependent voltage from being copied via the example voltage mirror 410. In examples disclosed herein, the example transistor 435 receives the example supply voltage $V_{SUPPLY,T}$ 400, the example read voltage $V_{RD}$ 402, and the generated example current 404 in response to the example EN signal 440. In examples disclosed herein, the example EN signal 440 may be provided to the example transistor 450 when the example switch 205b closes (FIG. 2). Subsequently, the example transistor 435 and the example temperature dependent device 405 deliver a voltage, respectively, to the example transistor 420a of the example voltage mirror 410.

The example temperature dependent device 405 establishes and generates a temperature dependency and delivers a temperature dependent voltage to a source terminal of the example transistor 420a. The example transistor 420a receives current from the example transistor 435, and the temperature dependent voltage from the example temperature dependent device 405, and copies, or minors, a temperature dependent voltage to the example transistor 420b (e.g., the temperature dependent voltage is mirrored via the example voltage minor 410). In examples disclosed herein, the temperature dependent voltage at the example transistor 420b may be trimmed to a certain magnitude.

In examples disclosed herein, the example TDRCG 215 may trim a temperature dependent voltage to a magnitude, or value, to generate the example temperature dependent reference current $I_{REF,T}$ 240 at a magnitude required to track or match the example bit cell current $I_{BIT}$ 130 across temperature variations. In some examples, the TDRCG 215 may receive an example trim signal(s) (TRIM) 455 from a logic controller (e.g., a CPU) at certain ones of example transistors 460a-d. A source and a base terminal of each of the example transistors 460a-d are coupled, however, terminals of the example transistors 460a-d may be coupled in any other fashion. Although FIG. 4 illustrates transistors 460a-d as n-channel transistors, any number and/or type(s) of transistor may be implemented to receive the example TRIM signal(s) 455. The example TRIM signal(s) 455 may be received, or directed to, certain ones of the example transistors 460a-d to trim a temperature dependent voltage and the example temperature dependent reference current $I_{REF,T}$ 240. Certain ones of the example transistors 460a-d may respond to the example TRIM signal(s) 455 by connecting to ground. In examples disclosed herein, when certain ones of the example transistors 460a-d are grounded, a voltage across certain ones of example resistors 465a-d change. The example resistors 465a-d may exhibit any value of electrical resistance and may alternatively be implemented via potentiometers and/or any type(s) of variable resistor. The example resistors 465a-d serve as a voltage divider and increase or decrease a magnitude of a temperature dependent voltage at a drain terminal of the example transistor 420b based on certain ones of the example transistors 460a-d receiving the example TRIM(s) signal 455. In this manner, the example TRIM signal(s) 455, the example transistors 460a-d, and the example resistors 465a-d, referred to herein as TDRCG trim circuitry, may be implemented in the example TDRCG 215 to trim a magnitude of a temperature dependent voltage and the example temperature dependent reference current $I_{REF,T}$ 240.

In examples disclosed herein, a temperature dependent voltage, trimmed or untrimmed (e.g., not adjusted in magnitude by the TDRCG trim circuitry), cause a temperature dependent current to be delivered to the example current minor 415b. The temperature dependent current is copied, or mirrored, via the example current mirrors 415a-b during the normal, or default, mode(s) (e.g., in response to an erase and/or erase-verify operation). In examples disclosed herein, the temperature dependent current may be copied, or mirrored, via certain ones of the example transistors 425a-d during the normal, or default, mode(s), to preserve a magnitude of the temperature dependent current. The temperature dependent current is delivered via an example resistor 470 and outputted to or sourced from the example current mirror 225a (FIG. 2) as the example temperature dependent reference current $I_{REF,T}$ 240.

In some examples, the example TDRCG 215 adjusts a trimmed or untrimmed temperature dependent current via the example current minors 415a-b during the legacy mode(s) is initiated. In the illustrated example of FIG. 4, the example programmable latches 430a-e may receive a legacy (LEGACY) signal(s) 475 from a logic controller such as, for example, a CPU. In examples disclosed herein, the LEGACY signal 475 is received via example transistor 480. The example transistor 480 is an n-channel CMOS transistor, however, any type(s) of transistor(s) may be used. A base and a source terminal of the example transistor 480 are provided the example read voltage $V_{RD}$ 402 and coupled to the base and the source terminals of the example transistors 425a-d. A drain terminal of the example transistor 480 is coupled to the drain terminals of the example transistors 425c-d and the gate terminals of the example transistors 425a-d via the example programmable latches 430a-d, respectively.

The example LEGACY signal 475 activates or selects certain ones, or quantities, of the example programmable latches 430a-e. In some examples, based on the strength, intensity, frequency, etc. of the LEGACY signal 475, certain ones, or quantities, of the example programmable latches 430a-e activate, or select, certain ones of the example transistors 425a-d, 435 to conduct. In other words, the example LEGACY signal 475 may open or close certain ones of the example current mirrors 415a-b and/or terminate delivery of the example supply voltage $V_{SUPPLY,T}$ 400 to the example transistor 435. In examples disclosed herein, the LEGACY signal 475 establishes a ratio of conducting to non-conducting current mirrors required to track, or match, a magnitude of the example bit cell current $I_{BIT}$ 130 when the example voltage dependent reference current $I_{REF,V}$ 245 is not generated. For example, the LEGACY signal 475 may cause the example programmable latches 430a-e to activate, or to select, certain ones of the example transistors 425a-d, 435 and/or current mirrors 415a-b to conduct or not conduct. Based on the ratio of conducting to non-conducting current mirrors, a temperature dependent current delivered via the example current minors 415a-b is trimmed to track, or match, a magnitude of the example bit cell current $I_{BIT}$ 130 without the voltage dependent reference current $I_{REF,V}$ 245 (e.g., the current $I_{REF,T}$ 240 and the current $I_{REF,V}$ 245 are not summed during the legacy mode(s)). In some examples, a temperature dependent current may be trimmed to increase a magnitude of the example temperature dependent reference current $I_{REF,T}$ 240 provided to the example current minor 225a (FIG. 2) to compensate for the absence of the voltage dependent reference current $I_{REF,V}$ 245. In examples disclosed herein, a temperature dependent current is trimmed in response to the legacy mode(s) as a result of certain ones of the current mirrors 415a-b and/or transistors 425a-d, 435 amplifying or attenuating the temperature dependent current. A resultant magnitude of a temperature dependent current, following trim operations, is the example temperature dependent reference current $I_{REF,T}$ 240. The example temperature dependent reference current $I_{REF,T}$ 240 is subsequently delivered to the example current minor 225a.

Figure 5:
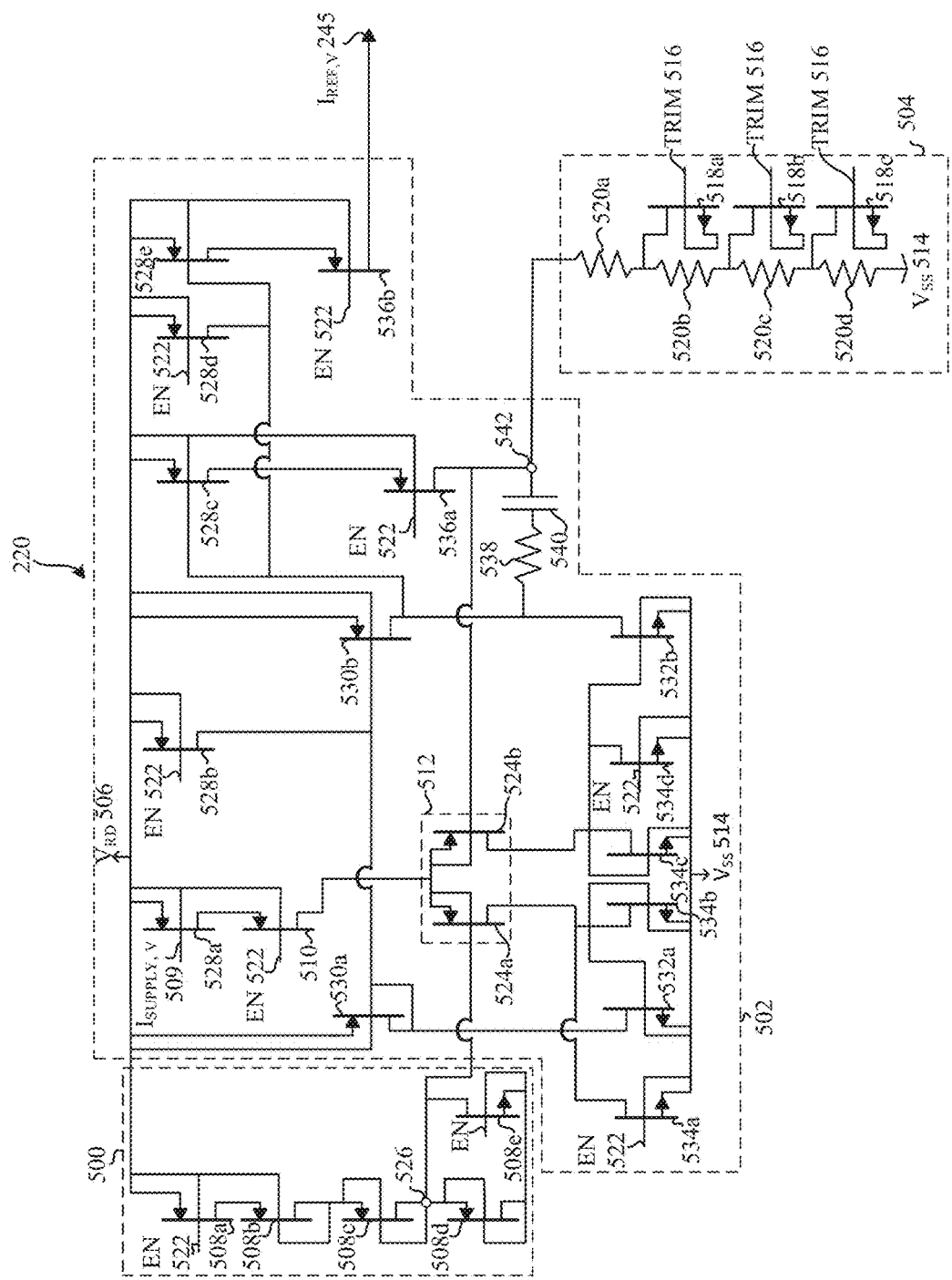
FIG. 5 is an illustration of an example voltage dependent reference current generator of FIG. 2.

FIG. 5 depicts an example architecture of the example VDRCG 220. The example VDRCG 220 generates a current that tracks changes in voltage across one or more of the example bit cells 120. The example VDRCG 220 includes an example voltage divider 500, an example operational amplifier (op amp) 502, and an example resistor divider 504.

The example voltage divider 500 is a circuit, device, and/or integrated circuit(s) that produces an output voltage that is a fraction (e.g., one third) of an input voltage. In examples disclosed herein, the example voltage divider 500 induces, or generates, a voltage dependency to generate the example voltage dependent reference current $I_{REF,V}$ 245. The example voltage divider 500 is supplied an example read voltage ($V_{RD}$) 506 and includes example transistors 508a-e.

The example op amp 502 is a transconductance operational amplifier (e.g., a circuit, a device, and/or an integrated circuit) that generates a voltage dependent current. The op amp 502 is supplied an example supply current $I_{SUPPLY,V}$ 509, the example read voltage ($V_{RD}$) 506, and an example reference voltage $V_{SS}$ 514. The example op amp 502 includes an example switch 510 and an example differential amplifier 512.

The example resistor divider 504 is a circuit, device, and/or integrated circuit(s) that trims a voltage dependent current generated by the example op amp 502. In some examples, the example resistor divider 504 serves as a voltage divider and increases or decreases a voltage dependent current. The example resistor divider 504 is supplied the example reference voltage $V_{SS}$ 514, and in some examples, an example trim (TRIM) signal(s) 516. The example resistor divider 504 includes example transistors 518*a-c* and example resistors 520*a-d*.

Turning to the example voltage divider 500, the example transistors 508*a-d* are similar or identical to the example transistors 300*a-f* of FIG. 3. In examples disclosed herein, the example transistors 508*a-d* are p-channel CMOS transistors, however, the example transistors 508*a-d* may be implemented by any type(s) of transistor in any arrangement or fashion. The example transistor 508*e* is similar or identical to the example transistors 250*a-d* of FIG. 2 and/or the example transistors 420*a-b* of FIG. 4. In examples disclosed herein, the example transistor 508*e* is an n-channel CMOS transistor, however, the example transistor 508*e* may be implemented by any type(s) of transistor in any arrangement or fashion.

In some examples, the example voltage divider 500 may be designed as follows. The example voltage divider 500 may be implemented by coupling a source terminal of the example transistor 508*a* to a base terminal of the example transistor 508*a* and supplying the example read voltage $V_{RD}$ 506 to the source and the base terminals. A drain terminal of the example transistor 508*a* is coupled to a source terminal of the example transistor 508*b*. A base terminal of the example transistor 508*b* is coupled to the source and the base terminals of the example transistor 508*a* and is supplied the example read voltage $V_{RD}$ 506. A drain terminal of the example transistor 508*b* is coupled to a gate terminal of the example transistor 508*b* and a source and a base terminal of the example transistor 508*c*. Also, the source terminal is coupled to the base terminal in the example transistor 508*c*. A gate terminal of the example transistor 508*c* is coupled to a drain terminal of the example transistor 508*c*, a source and a base terminal of the example transistor 508*d*, a drain terminal of the example transistor 508*e*, and the example differential amplifier 512. The source terminal of the example transistor 508*d* is coupled to the base terminal of the example transistor 508*d*. A drain terminal of the example transistor 508*d* is coupled to a gate terminal of the example transistor 508*d* and a source terminal of the example transistor 508*e*. The source terminal of the example transistor 508*e* is coupled to a base terminal of the example transistor 508*e*. Additionally or alternatively, the example transistors 508*a-e* of the example voltage divider 500 may be connected, or coupled, in any other fashion.

In some examples, the example voltage divider 500 may operate as follows. In examples disclosed herein, the example transistor 508*a* may receive an enable (EN) signal 522 from a logic controller such as, for example, a CPU. In the illustrated example of FIG. 5, the example EN signal 522 may also be received by other components of the example VDRCG 220. The example EN signal 522 may be received in response to a normal, or default, mode(s) as a result of an erase operation and/or an erase-verify operation. The example EN signal 522 may also be received in response to initiation of a legacy mode(s), a temperature test mode(s), and a voltage test mode(s). For example, the EN signal 522 received in response to the normal, or default, mode(s) and the voltage test mode(s) may initiate operation of the example voltage divider 500, facilitate generation of a voltage dependent current, and ultimately facilitate generation of the example voltage dependent reference current $I_{REF,V}$ 245. In such examples, the example voltage divider 500 divides the example read voltage $V_{RD}$ 506 via the example transistors 508*a-e*, generates a voltage dependency, and outputs a divided voltage to the example differential amplifier 512. However, in some examples, the EN signal 522 received in response to the legacy mode(s) and the temperature test mode(s) may disable operation of the example voltage divider 500 and prevent generation of a voltage dependent current and the example voltage dependent reference current $I_{REF,V}$ 245. In such examples, the example EN signal 522 may provide a voltage of any magnitude and/or polarity or cause the example transistor 508*a* to connect to ground. To that end, the example EN signal 522 may prevent the example transistors 508*a-e* from receiving and/or dividing the example read voltage $V_{RD}$ 506.

Turning to the example op amp 502, the example switch 510 is a transistor similar or identical to the example transistors 508*a-d*. In examples disclosed herein, the example switch 510 is a p-channel CMOS transistor, however, any type(s) of transistor(s) may be implemented. The example switch 510, upon reception of a signal, is capable of disabling operation of the example op amp 502 and the example VDRCG 220. In examples disclosed herein, the example switch 510 relays or ceases current flow to the example differential amplifier 512. In some examples, the example switch 510 relays a voltage and a current to the example differential amplifier 512 upon initiation of the normal, or default, mode(s) and the voltage test mode(s). In other examples, the example switch ceases current flow to the example differential amplifier 512 in response to the legacy mode(s) and the temperature test mode(s). In examples disclosed herein, operation of the example switch 510 determines whether the example voltage dependent reference current $I_{REF,V}$ 245 is generated.

The example differential amplifier 512 amplifies a difference between two or more input voltages. In the illustrated example, the example differential amplifier 512 is a transconductance differential amplifier that outputs a current and a voltage. In examples disclosed herein, the example differential amplifier 512 receives and compares a feedback voltage provided by the example resistor divider 504 with a divided voltage magnitude (e.g., a fraction of the example read voltage $V_{RD}$ 506) provided by the example voltage divider 500. The example differential amplifier 512 supplements a process of trimming the example voltage dependent reference current $I_{REF,V}$ 245 in association with the example resistor divider 504. The example differential amplifier 512 includes example transistors 524*a-b*.

The example transistors 524*a-b* are similar or identical to the example transistors 508*a-d*, 510. In examples disclosed herein, the example transistors 524*a-b* of the example differential amplifier 512 are p-channel CMOS transistors, however, any type(s) of transistor may be used. The example transistor 524*a* receives an input voltage, identical in magnitude to a voltage at node 526 of the example voltage divider 500. The example transistor 524*b* receives a different input voltage from the example resistor divider 504. The example transistors 524*a-b* match, or compare, the input voltages and subsequently generate and output a voltage dependent current via drain terminals. In examples disclosed herein, the input voltage received at transistor 524*b* from the example resistor divider 504 varies based on trim operations and results in varying magnitudes of voltage dependent current outputted from the example differential amplifier 512.

In some examples, the example op amp 502 may be designed as follows. The example op amp 502 may be implemented by supplying the read voltage $V_{RD}$ 506 to a source and a base terminal of each of example transistors 528a-e. The base and the source terminals of the example transistors 528a-e are coupled to the base and the source terminals of the example transistor 508a. In examples disclosed herein, the example transistors 528a-e are p-channel CMOS transistors, however, any type(s) of transistor may be used. A drain terminal of the example transistor 528a is coupled to a source terminal of the example switch 510. A base terminal of the example switch 510 is coupled to the source and the base terminal of the example transistor 528a and is also supplied the example read voltage $V_{RD}$ 506. A drain terminal of the example switch 510 is coupled to a source and a base terminal of each of the example transistors 524a-b.

In the illustrated example of FIG. 5, a gate terminal of the example transistor 524a is provided a divided voltage magnitude (e.g., a fraction of the example read voltage $V_{RD}$ 506) from the example voltage divider 500. A drain terminal of the example transistor 528b is coupled to a gate terminal of each of example transistors 530a-b. The example transistors 530a-b are DEPMOS transistors, however, any type(s) of transistor may be used. In examples disclosed herein, the example transistors 530a-b are implemented as a current minor. A source and a base terminal of each of the example transistors 530a-b is supplied the example read voltage $V_{RD}$ 506 and coupled to the source and the base terminals of the example transistors 508a, 528a-e. A drain terminal of the example transistor 530a is coupled to the gate terminal of the example transistor 530a. The drain and the gate terminal of the example transistor 530a are coupled to a drain terminal of an example transistor 532a. A drain terminal of the example transistor 530b is coupled to a drain terminal of an example transistor 532b.

The example transistors 532a-b are DENMOS transistors, however, any type(s) of transistor may be used. A base and a source terminal of each of the example transistors 532a-b are supplied the example reference voltage $V_{SS}$ 514 and coupled to a source and a base terminal of each of example transistors 534a-d.

The example transistors 534a-d are DENMOS transistors similar or identical to the example transistors 532a-b, however, any type(s) of transistor may be used. The source and the base terminal of each of the example transistors 534a-d are supplied the example reference voltage $V_{SS}$ 514. In the illustrated example of FIG. 5, a drain terminal of the example transistor 534a is coupled to a drain terminal of the example transistor 524a, a gate terminal of the example transistor 532a, and a drain and a gate terminal of the example transistor 534b. A drain terminal of the example transistor 524b is coupled to a gate and a drain terminal of the example transistor 534c, a drain terminal of the example transistor 534d, and a gate terminal of the example transistor 532b.

In the illustrated example of FIG. 5, the drain terminal of the example transistor 530b is coupled to a gate terminal of the example transistor 528c, a drain terminal of the example transistor 528d, and a gate terminal of the example transistor 528e. The base terminal of the example transistor 528c is coupled to a base terminal of an example transistor 536a. A drain terminal of the example transistor 528c is coupled to a source terminal of the example transistor 536a. The base terminal of the example transistor 528e is coupled to a base terminal of an example transistor 536b. The base terminal of the example transistor 536b is provided the example read voltage $V_{RD}$ 506. A drain terminal of the example transistor 528e is coupled to a source terminal of the example transistor 536b. In the illustrated example, the example transistors 536a-b are p-channel CMOS transistors, however, any type(s) of transistor may be used.

In the illustrated example of FIG. 5, the drain terminal of the example transistor 530b and the drain terminal of the example transistor 532b are coupled to an example resistor 538 and an example capacitor 540 connected in series, referred to herein as an RC load. In the example implementation of the example VDRCG 220 of FIG. 5, the example resistor 538 may exhibit any value of electrical resistance and may alternatively be implemented via potentiometers and/or any type(s) of variable resistor(s). The example capacitor 540 of FIG. 5 is a metal-oxide semiconductor (MOS) capacitor, however, any type(s) of capacitor(s) may be used to implement the example capacitor 540.

In the illustrated example of FIG. 5, a gate terminal of the example transistor 524b is coupled to a drain terminal of the example transistor 536a and coupled to the drain terminal of the example transistor 530b and the drain terminal of the example transistor 532b via the RC load. The gate terminal of the example transistor 524b and the drain terminal of the example transistor 536a are coupled to the example resistor divider 504. In some examples, the example op amp 502 may implement the example switch 510, the example differential amplifier 512, the example transistors 524a-536b, and/or the RC load using any architecture or design.

In some examples, the example op amp 502 may operate as follows. The example transistor 528a receives the example supply current $I_{SUPPLY,V}$ 509 at a gate terminal of the example transistor 528a. A logic controller such as, for example, a CPU may deliver the enable (EN) signal 522 to the example op amp 502 to facilitate generation of a voltage dependent current. The example switch 510 may receive the EN signal 522 and enable or disable operation of the example op amp 502. Additionally or alternatively, ones of the example transistors 528b, 534a, 534d, 536a, and/or 536b may receive the example EN signal 522 and support the example switch 510 in enabling or disabling generation of the example voltage dependent reference current $I_{REF,V}$ 245. In the illustrated example of FIG. 5, the example switch 510 supplies the example differential amplifier 512 with a voltage and a current when generation of the example voltage dependent reference current $I_{REF,V}$ 245 is enabled in response to, for example, initiation of the normal, or default, mode(s) and the voltage test mode(s). The example differential amplifier 512 may subsequently generate a voltage dependent current when generation of the example voltage dependent reference current $I_{REF,V}$ 245 is enabled. In other examples, the example switch 510 does not supply the example differential amplifier 512 with a substantial voltage and/or current when generation of the example voltage dependent reference current $I_{REF,V}$ 245 is disabled in response to, for example, initiation of the legacy mode(s) and temperature test mode(s). To that end, the example differential amplifier 512 does not generate a voltage dependent current when generation of the example voltage dependent reference current $I_{REF,V}$ 245 is disabled (e.g., a legacy mode(s) or a temperature test mode(s)).

The example differential amplifier 512 generates a voltage dependent current at the drain terminals of the example transistors 524a-b by comparing a divided voltage magnitude (e.g., a fraction of the example read voltage $V_{RD}$ 506) provided by the example voltage divider 500 (e.g., node 526) to a voltage at an example node 542. The voltage at the example node 542 varies based on trim operations and the example resistor divider 504. As a result of varying voltage at the example node 542, a varying feedback voltage is provided to the example transistor 524b (e.g., and thus the differential amplifier 512) and enables a voltage dependent current of varying magnitude. A voltage dependent current is delivered to and copied, or mirrored, via the example transistors 532a-b, 534a-d. A voltage dependent current is outputted via the drain terminal of the example transistor 532b and stabilized by the RC load. The RC load stabilizes a voltage dependent current and the voltage at the example node 542 by reducing voltage and current gains at any frequency. The RC load supports providing the example differential amplifier 512 with a voltage at the example node 542 and stabilizes the example differential amplifier 512.

In examples disclosed herein, the example resistor divider 504 may trim a voltage dependent current to a magnitude or value to generate the example voltage dependent reference current $I_{REF,V}$ 245 at a magnitude required to track or match the example bit cell current $I_{BIT}$ 130 (FIG. 1) across voltage variations. In some examples, the example resistor divider 504 may receive the example trim signal(s) (TRIM) 516 from a logic controller (e.g., a CPU) at certain ones of the example transistors 518a-c. A source and a base terminal of each of the example transistors 518a-c are coupled, however, terminals of the example transistors 518a-c may be coupled or designed in any other fashion. Although FIG. 5 illustrates transistors 518a-c as n-channel transistors, any number and/or type(s) of transistor may be implemented to receive the example TRIM signal(s) 516. The TRIM signal(s) 516 may be received, or directed to, certain ones of the example transistors 518a-c to trim a voltage dependent current. Certain ones of the example transistors 518a-c may respond to the example TRIM signal(s) 516 by connecting to ground. In examples disclosed herein, when certain ones of the example transistors 518a-c are grounded, a voltage across certain ones of the example resistors 520a-d change. The example resistors 520a-d may exhibit any value of electrical resistance and may alternatively be implemented via potentiometers and/or any type(s) of variable resistor. The example resistors 520a-d serve as a voltage divider and increase or decrease a magnitude of the voltage at the example node 542 based on certain ones of the example transistors 518a-c receiving the example TRIM(s) signal 516. In this manner, the example TRIM signal(s) 516, the example transistors 518a-c, and the example resistors 520a-d of the example resistor divider 504 may be implemented to trim a magnitude of a voltage dependent current generated by the differential amplifier 512.

Turning back to the example operation of the example op amp 502, a voltage dependent current outputted from the drain terminal of the example transistor 532b, stabilized by the RC load, and trimmed by the example resistor divider 504 is copied or mirrored via the example transistors 528c-e, 530b, and 536a-b. In the illustrated example of FIG. 5, a voltage dependent current is outputted from a drain terminal of the example transistor 536b as the example voltage dependent reference current $I_{REF,V}$ 245. The example voltage dependent reference current $I_{REF,V}$ 245 is subsequently delivered to the example current mirror 225a of FIG. 2.

While an example manner of implementing the example reference current generator 115 of FIG. 1 is illustrated in FIG. 2, one or more of the elements, processes and/or devices illustrated in FIG. 2 may be combined, divided, re-arranged, omitted, eliminated and/or implemented in any other way. Further, the example programmable current mirror(s) 201, the example switches 205a-b, the example CCG 210, the example TDRCG 215, the example VDRCG 220 and/or, more generally, the example reference current generator 115 of FIGS. 1 and 2 may be implemented by hardware, software, firmware and/or any combination of hardware, software and/or firmware. Thus, for example, any of the example programmable current mirror(s) 201, the example switches 205a-b, the example CCG 210, the example TDRCG 215, the example VDRCG 220 and/or, more generally, the example reference current generator 115 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example programmable current mirror(s) 201, the example switches 205a-b, the example CCG 210, the example TDRCG 215, and the example VDRCG 220 is/are hereby expressly defined to include a tangible computer readable storage device or storage disk such as a memory, a digital versatile disk (DVD), a compact disk (CD), a Blu-ray disk, etc. storing the software and/or firmware. Further still, the example reference current generator 115 of FIG. 1 may include one or more elements, processes and/or devices in addition to, or instead of, those illustrated in FIG. 2, and/or may include more than one of any or all of the illustrated elements, processes and devices.

Figure 6:
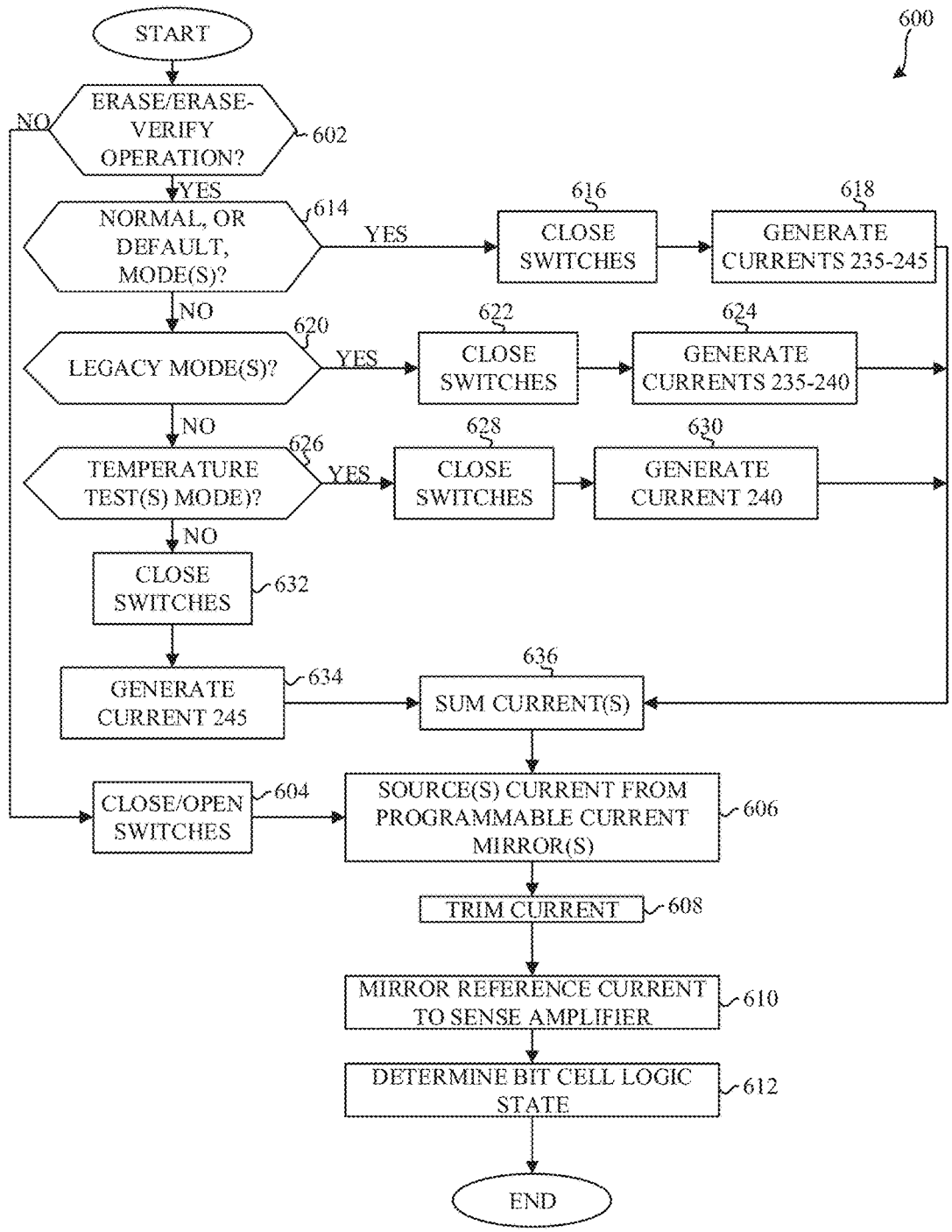
FIG. 6 is a flowchart representative of example operations that may transpire to implement the example reference current generator of FIGS. 1 and 2.

A flowchart representative of example machine readable instructions for implementing the example reference current generator 115 of FIGS. 1 and 2 is shown in FIG. 6. In this example, the machine readable instructions include a program for execution by a processor such as the processor 712 shown in the example processor platform 700 discussed below in connection with FIG. 7. The program may be embodied in software stored on a tangible computer readable storage medium such as a CD-ROM, a floppy disk, a hard drive, a digital versatile disk (DVD), a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowchart illustrated in FIG. 6, many other methods of implementing the example reference current generator 115 may alternatively be used. For example, the order of execution of the blocks may be changed, and/or some of the blocks described may be changed, eliminated, or combined.

As mentioned above, the example process of FIG. 6 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk wherein information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIG. 6 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk wherein information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 6 is a flowchart representative of example operations and/or instructions that may transpire to implement the example reference current generator 115 of FIGS. 1 and 2. The example reference current generator 115 detects programmable non-volatile memory operations such as read operations, write operations, program-verify operations, erase operations, and erase-verify operations. The example operations process 600 transpires when a logic controller such as, for example, a CPU determines whether an erase or erase-verify operation is detected (Block 602). If an erase or erase-verify operation is not detected (Block 602 returns a result of NO), ones of the example switches 205a-b receive enable or disable signals. In the illustrated example of FIG. 6, the example switch 205a closes while the example switch 205b remains open (Block 604). A conductive path is established from the example programmable current mirror(s) 201 to the example current source 200a via closed switch 205a. The example current source 200a sources the example supply current $I_{SUPPLY}$ 200b from the example programmable current mirror(s) 201 such that the example input current $I_{IN}$ 265 is equal to the example supply current $I_{SUPPLY}$ 200b (Block 606). In examples disclosed herein, the example input current $I_{IN}$ 265 may be sourced from the example programmable current mirror(s) 201 of FIG. 3. The example programmable current mirror(s) 201 may receive an enable signal(s) such as, for example, the example EN signal 260 of FIG. 2, and trim the example input current $I_{IN}$ 265 (Block 608). The example input current $I_{IN}$ 265 may be trimmed to match or track the example bit cell current $I_{BIT}$ 130. However, in some examples, a magnitude of the example input current $I_{IN}$ 265 copied or mirrored to the example current mirror(s) 225b matches or tracks the example bit cell current $I_{BIT}$ 130. In such examples, the example programmable current mirror(s) 201 does not trim the example input current $I_{IN}$ 265 (e.g., Block 608 is bypassed).

The example input current $I_{IN}$ 265, copied or mirrored via the example programmable current mirror(s) 201, modifies a magnitude of the example reference current $I_{REF}$ 135. The example reference current $I_{REF}$ 135 is subsequently copied or mirrored through the example current mirror 225b (FIG. 2) (Block 610). As a result, the example reference current $I_{REF}$ 135 is sensed or detected at the example sense amplifier 110. The example sense amplifier 110 compares the example reference current $I_{REF}$ 135 to the example bit cell current $I_{BIT}$ 130. The example sense amplifier 110 subsequently determines the bit cell(s) logic level 140 (e.g., the bit cell(s) logic state) (Block 612). After determination of the example bit cell logic level 140 at block 612, the example operations and/or instructions process 600 ends. However, in some examples, the example sense amplifier 110 may continue comparing the example reference current $I_{REF}$ 135 to the example bit cell current $I_{BIT}$ 130 until an erase or erase-verify operation is detected by the example reference current generator 115.

If an erase or erase-verify operation is detected (Block 602 returns a result of YES), the logic controller (e.g., a CPU) may determine whether the example memory architecture 100 is operating during a normal, or default, mode(s) (Block 614).

If the example memory architecture 100 is operating during the normal, or default, mode(s) (Block 614 returns a result of YES), the example switches 205a-b receive enable signals. In the illustrated example of FIG. 6, the example switches 205a-b close (Block 616). A conductive path is established between the example programmable current mirror(s) 201 and the example current source 200a via closed switch 205a. Additionally, a conductive path is established between the example programmable current mirror(s) 201 and the example CCG 210, the example TDRCG 215, and the example VDRCG 220 via closed switch 205b and the example current mirror 225a. The example CCG 210 receives enable signals and initiates generation of the example constant reference current $I_{REF,C}$ 235. The example TDRCG 215 receives enable signals, such as the example EN signal(s) 440 of FIG. 4, and initiates generation of the example temperature dependent reference current $I_{REF,T}$ 240. The example VDRCG 220 receives enable signals, such as the example EN signal(s) 522 of FIG. 5, and initiates generation of the example voltage dependent reference current $I_{REF,V}$ 245. The example CCG 210, the example TDRCG 215, and the example VDRCG 220 subsequently generate the example constant reference current $I_{REF,C}$ 235, the example temperature dependent reference current $I_{REF,T}$ 240, and the example voltage dependent reference current $I_{REF,V}$ 245, respectively (Block 618). The example CCG 210 generates the example constant reference current $I_{REF,C}$ 235 and delivers, or sources, the example constant reference current $I_{REF,C}$ 235 to, or from, the example current minor 225a. The example TDRCG 215 generates the example temperature dependent reference current $I_{REF,T}$ 240 and delivers, or sources, the example temperature dependent reference current $I_{REF,T}$ 240 to, or from, the example current minor 225a. In some examples, the temperature dependent reference current $I_{REF,T}$ 240 is generated by the example TDRCG 215 illustrated in FIG. 4. The example VDRCG 220 generates the example voltage dependent reference current $I_{REF,V}$ 245 and delivers, or sources, the example voltage dependent reference current $I_{REF,V}$ 245 to, or from, the example current minor 225a. In some examples, the voltage dependent reference current $I_{REF,V}$ 245 is generated by the example VDRCG 220 illustrated in FIG. 5.

If the example memory architecture 100 is not operating during the normal, or default, mode(s) (Block 614 returns a result of NO), a logic controller (e.g., a CPU) may determine whether the example memory architecture 100 is operating during a legacy mode(s) (Block 620). If the example memory architecture 100 is operating during the legacy mode(s) (Block 620 returns a result of YES), the example switches 205a-b receive enable signals. In the illustrated example of FIG. 6, the example switches 205a-b close (Block 622). A conductive path is established between the example programmable current mirror(s) 201 and the example current source 200a via closed switch 205a. Additionally, a conductive path is established between the example programmable current mirror(s) 201 and the example CCG 210, the example TDRCG 215, and the example VDRCG 220 via closed switch 205b and the example current mirror 225a. The example CCG 210 receives enable signals and initiates generation of the example constant reference current $I_{REF,C}$ 235. The example TDRCG 215 receives enable signals, such as the example EN signal(s) 440 of FIG. 4, and initiates generation of the example temperature dependent reference current $I_{REF,T}$ 240. The example VDRCG 220 receives disable signals, such as the example EN signal(s) 522 of FIG. 5, and ceases or terminates generation of the example voltage dependent reference current $I_{REF,V}$ 245. The example TDRCG 215 also receives the example LEGACY signal 475 and trims a temperature dependent current in order to appropriately generate the example temperature dependent reference current $I_{REF,T}$ 240. The example CCG 210 and the example TDRCG 215 generate the example constant reference current $I_{REF,C}$ 235 and the example temperature dependent reference current $I_{REF,T}$ 240, respectively (Block 624). The example CCG 210 generates the example constant reference current $I_{REF,C}$ 235 and delivers, or sources, the example constant reference current $I_{REF,C}$ 235 to, or from, the example current mirror 225a. The example TDRCG 215 generates the example temperature dependent reference current $I_{REF,T}$ 240 and delivers, or sources, the example temperature dependent reference current $I_{REF,T}$ 240 to, or from, the example current minor 225a. The generated temperature dependent reference current $I_{REF,T}$ 240 tracks or matches the example bit cell current $I_{BIT}$ 130 and compensates for absence of the example voltage dependent reference current $I_{REF,V}$ 245. In some examples, the temperature dependent reference current $I_{REF,T}$ 240 is generated by the example TDRCG 215 illustrated in FIG. 4

If the example memory architecture 100 is not operating during the legacy mode(s) (Block 620 returns a result of NO), a logic controller (e.g., a CPU) may determine whether the example memory architecture 100 is operating during a temperature test mode(s) (Block 626). If the example memory architecture 100 is operating during the temperature test mode(s) (Block 620 returns a result of YES), the example switches 205a-b receive enable signals. In the illustrated example of FIG. 6, the example switches 205a-b close (Block 628). A conductive path is established between the example programmable current mirror(s) 201 and the example current source 200a via closed switch 205a. Additionally, a conductive path is established between the example programmable current mirror(s) 201 and the example CCG 210, the example TDRCG 215, and the example VDRCG 220 via closed switch 205b and the example current minor 225a. The example TDRCG 215 receives enable signals, such as the example EN signal(s) 440 of FIG. 4, and initiates generation of the example temperature dependent reference current $I_{REF,T}$ 240. The example VDRCG 220 receives disable signals, such as the example EN signal(s) 522 of FIG. 5, and ceases or terminates generation of the example voltage dependent reference current $I_{REF,V}$ 245. The example CCG 210 receives disable signals and ceases or terminates generation of the example constant reference current $I_{REF,C}$ 235. Then, the example TDRCG 215 generates the example temperature dependent reference current $I_{REF,T}$ 240 (Block 630). The example TDRCG 215 generates the example temperature dependent reference current $I_{REF,T}$ 240 and delivers, or sources, the example temperature dependent reference current $I_{REF,T}$ 240 to, or from, the example current minor 225a. The generated temperature dependent reference current $I_{REF,T}$ 240 tracks or matches the example bit cell current $I_{BIT}$ 130 and compensates for absence of the example voltage dependent reference current $I_{REF,V}$ 245 and the example constant reference current $I_{REF,C}$ 235. In some examples, the example temperature dependent reference current $I_{REF,T}$ 240 is generated by the example TDRCG 215 illustrated in FIG. 4.

If the example memory architecture 100 is not operating during the temperature test mode(s) (Block 626 returns a result of NO), the logic controller (e.g., a CPU) determines that the example memory architecture 100 is operating during a voltage test mode(s) and the example switches 205a-b receive enable signals. In the illustrated example of FIG. 6, the example switches 205a-b close (Block 632). A conductive path is established between the example programmable current mirror(s) 201 and the example current source 200a via closed switch 205a. Additionally, a conductive path is established between the example programmable current mirror(s) 201 and the example CCG 210, the example TDRCG 215, and the example VDRCG 220 via closed switch 205b and the example current mirror 225a. The example TDRCG 215 receives disable signals, such as the example EN signal(s) 440 of FIG. 4, and ceases or terminates generation of the example temperature dependent reference current $I_{REF,T}$ 240. The example VDRCG 220 receives enable signals such as the example EN signal(s) 522 of FIG. 5, and initiates generation of the example voltage dependent reference current $I_{REF,V}$ 245. The example CCG 210 receives disable signals and ceases generation of the example constant reference current $I_{REF,C}$ 235. Then, the example VDRCG 220 generates the example voltage dependent reference current $I_{REF,V}$ 245 (Block 634). The example VDRCG 220 generates the example voltage dependent reference current $I_{REF,V}$ 245 and delivers, or sources, the example voltage dependent reference current $I_{REF,V}$ 245 to, or from, the example current mirror 225a. The generated voltage dependent reference current $I_{REF,V}$ 245 tracks or matches the example bit cell current $I_{BIT}$ 130 and compensates for absence of the example temperature dependent reference current $I_{REF,T}$ 240 and the example constant reference current $I_{REF,C}$ 235. In some examples, the example voltage dependent reference current $I_{REF,V}$ 245 is generated by the example VDRCG 220 illustrated in FIG. 5.

Based on the determined mode(s) of the example memory architecture 100, certain ones of the example constant reference current $I_{REF,C}$ 235, the example temperature dependent reference current $I_{REF,T}$ 240, and the example voltage dependent reference current $I_{REF,V}$ 245 are summed, combined, or added together at the drain terminal of the example transistor 250a of the example current minor 225a (Block 636). For example, if the example memory architecture 100 is operating during the normal, or default, mode(s), the example constant reference current $I_{REF,C}$ 235, the example temperature dependent reference current $I_{REF,T}$ 240, and the example voltage dependent reference current $I_{REF,V}$ 245 are summed or combined at the drain terminal of the example transistor 250a (following block 618). If the example memory architecture 100 is operating during the legacy mode(s), the example constant reference current $I_{REF,C}$ 235 and the example temperature dependent reference current $I_{REF,T}$ 240 are summed or combined at the drain terminal of the example transistor 250a (following block 624). Alternatively, if the example memory architecture 100 is operating during the temperature test mode(s), the example temperature dependent reference current $I_{REF,T}$ 240 is delivered to, or sourced from, the drain terminal of the example transistor 250a (following block 630) and block 636 is bypassed. Additionally, block 636 is bypassed if the example memory architecture 100 is operating during the voltage test mode(s) and the example voltage dependent reference current $I_{REF,V}$ 245 is delivered to, or sourced from, the drain terminal of the example transistor 250a (following block 634).

In the illustrated example of FIG. 6, certain ones of the example constant reference current $I_{REF,C}$ 235, the example temperature dependent reference current $I_{REF,T}$ 240, and the example voltage dependent reference current $I_{REF,V}$ 245 are copied or mirrored via the example current mirror 225a. As a result, a magnitude of the example current $I_{REF(V,T)}$ 255 at the drain terminal of the example transistor 250b is adjusted or modified to equal a current at the drain terminal of the example transistor 250a. The example current $I_{REF(V,T)}$ is sourced from the example programmable current mirror(s) 201 (Block 606). Additionally, the example current source 200a sources the example supply current $I_{SUPPLY}$ 200b from the example programmable current mirror(s) 201 (Block 606). As such, a magnitude of current sourced from the example programmable current mirror(s) 201 (e.g., the example input current $I_{IN}$ 265), is equal to the example supply current $I_{SUPPLY}$ 200b plus ones of the example currents $I_{REF,C}$ 235, $I_{REF,T}$ 240, and $I_{REF,V}$ 245 (e.g., depending on the mode(s) of operation). In examples disclosed herein, the example input current $I_{IN}$ 265 may be sourced from the example programmable current mirror(s) 201 of FIG. 3.

The example programmable current mirror(s) 201 may receive an enable signal(s) such as, for example, the example EN signal 260 of FIG. 2, and trim the example input current $I_{IN}$ 265 (Block 608). The example input current $I_{IN}$ 265 may be trimmed to match or track the example bit cell current $I_{BIT}$ 130. In some examples, the magnitude of the example input current $I_{IN}$ 265 delivered to, or sourced from, the example current mirror(s) 225b matches or tracks the example bit cell current $I_{BIT}$ 130 and the example programmable current mirror(s) 201 does not trim the example input current $I_{IN}$ 265 (e.g., Block 608 is bypassed).

The example input current $I_{IN}$ 265 copied or mirrored via the example programmable current mirror(s) 201 modifies a magnitude of the example reference current $I_{REF}$ 135. The example reference current $I_{REF}$ 135 is subsequently copied or mirrored through the example current mirror 225b (FIG. 2) (Block 610). In examples disclosed herein, the example reference current $I_{REF}$ 135 tracks or matches the example bit cell current $I_{BIT}$ 130 across temperature and/or voltage. For example, in response to detection of the normal, or default, mode(s), the example reference current $I_{REF}$ 135 tracks or matches the example bit cell current $I_{BIT}$ 130 across temperature and voltage. In response to detection of the legacy mode(s) or the temperature test mode(s), the example reference current $I_{REF}$ 135 tracks or matches the example bit cell current $I_{BIT}$ 130 across temperature. Alternatively, in response to detection of the voltage test mode(s), the example reference current $I_{REF}$ 135 tracks or matches the example bit cell current $I_{BIT}$ 130 across voltage.

As a result, the example reference current $I_{REF}$ 135 is sensed or detected at the example sense amplifier 110. The example sense amplifier 110 compares the example reference current $I_{REF}$ 135 to the example bit cell current $I_{BIT}$ 130. The example sense amplifier 110 subsequently determines the bit cell(s) logic level 140 (e.g., the bit cell(s) logic state) (Block 612). After determination of the example bit cell(s) logic level 140 at block 612, the example operations and/or instructions process 600 ends. However, in some examples, the example sense amplifier 110 may continue comparing the example reference current $I_{REF}$ 135 to the example bit cell current $I_{BIT}$ 130 until a read, a write, or a program-verify operation is detected. The example operations and/or instructions process 600 may subsequently return to block 602. In some examples, the example sense amplifier 110 may continue comparing the example reference current $I_{REF}$ 135 to the example bit cell current $I_{BIT}$ 130 until a mode(s) (e.g., normal, or default, mode(s), legacy mode(s), temperature test mode(s), and voltage test mode(s)), different than a mode(s) by which the example reference current generator 115 is currently generating the example reference current $I_{REF}$ 135, is detected. In such examples, the example operations and/or instructions process 600 may return to block 614.

Figure 7:
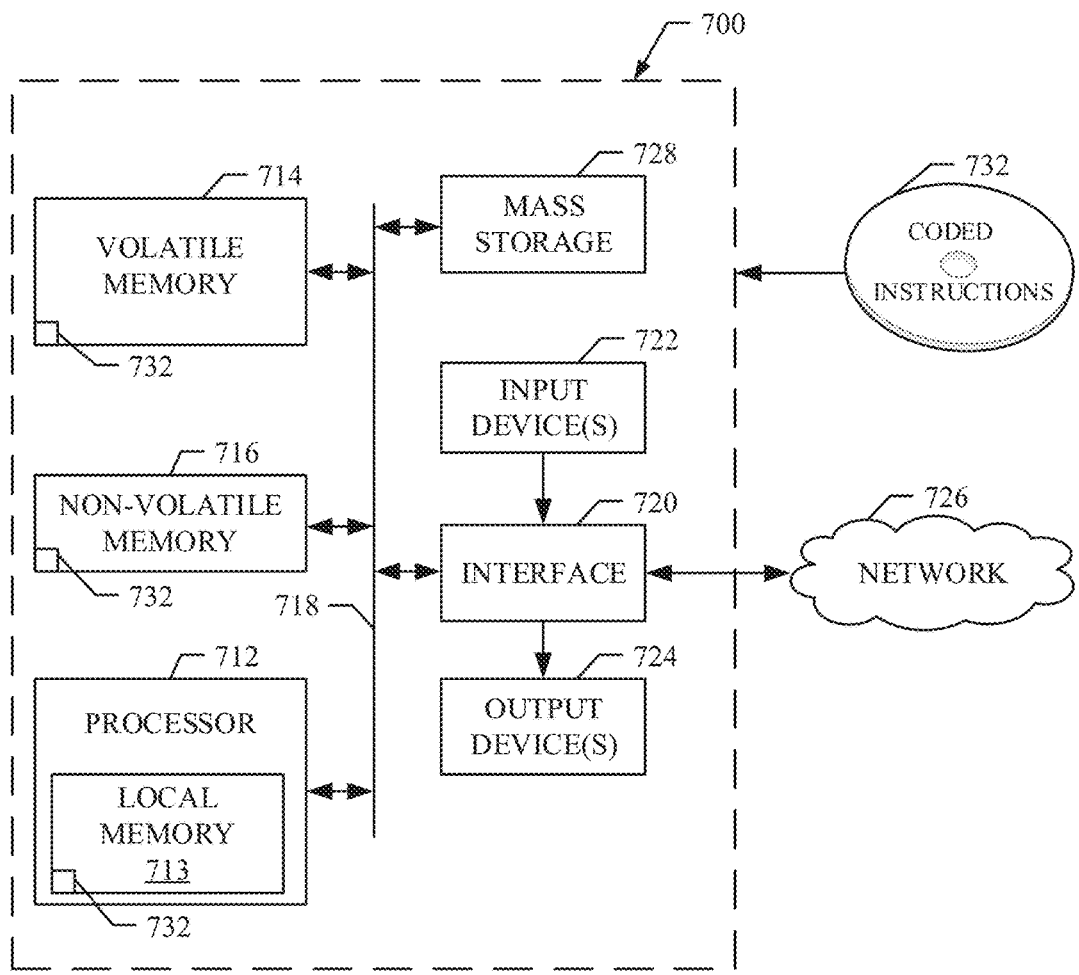
FIG. 7 is an example processor platform that may be used to execute the example machine-readable operations and/or instructions of FIG. 6.

FIG. 7 is a block diagram of an example processor platform 700 capable of executing the instructions of FIG. 6 to implement the example memory architecture of FIG. 1. The processor platform 700 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), and/or a PCI express interface.

In the illustrated example, one or more input devices 722 are connected to the interface circuit 720. The input device(s) 722 permit(s) a user to enter data and commands into the processor 712. The input device(s) 722 can be implemented by, for example, an audio sensor, a microphone, a camera (still or video), a keyboard, a button, a mouse, a touchscreen, a track-pad, a trackball, and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 720 of the illustrated example, thus, typically includes a graphics driver card, a graphics driver chip or a graphics driver processor.

The interface circuit 720 of the illustrated example also includes a communication device such as a transmitter, a receiver, a transceiver, a modem and/or network interface card to facilitate exchange of data with external machines (e.g., computing devices of any kind) via a network 726 (e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives.

The coded instructions 732 of FIG. 6 may be stored in the mass storage device 728, in the volatile memory 714, in the non-volatile memory 716, and/or on a removable tangible computer readable storage medium such as a CD or DVD.

From the foregoing, it will be appreciated examples disclosed herein match or track memory cell current in flash memory architectures based on temperature and voltage variations. Generating reference currents to match or track memory cell currents using a CMOS transistor implementation rather than a flash array reduces power consumption and improves electrical power efficiency of flash memory architectures. Moreover, the CMOS transistor implementation reduces surface area allocated to reference current generation architectures within flash memory architectures.

Additionally, it will be appreciated that the above-disclosed examples reduce memory cell logic state determination errors. Generating a reference current that tracks or matches memory cell current across temperature and voltage in response to erase or erase-verify operations reduces memory cell logic state determination errors and memory cell depletion. Examples disclosed above also improve flash memory lifetime due to reduced memory cell depletion.

In addition, it will be appreciated that the above-disclosed examples reduce flash memory testing complexity by enabling trim-able reference currents. For example, trimming voltage dependent and temperature dependent currents via the CMOS transistor implementation simplifies trim operations compared to conventional trimming implementations that erase and verify memory cells via flash reference arrays.

Although certain example methods and apparatus have been disclosed herein, the scope of coverage of this patent is not limited thereto. On the contrary, this patent covers all methods and apparatus fairly falling within the scope of the claims of this patent.

What is claimed is:

1. A method to track bit cell current in a memory architecture, the method comprising:
   generating a first reference current dependent on bit cell temperature;
   generating a second reference current dependent on bit cell voltage;
   supplying a third reference current of constant magnitude;
   summing the first reference current, the second reference current, and the third reference current; and
   determining, with a sense amplifier, a bit cell logic state based on the first reference current, the second reference current, and the third reference current.

2. A method as defined in claim 1, wherein generating at least one of the first reference current and the second reference current includes trimming at least one of the first reference current and the second reference current, respectively.

3. A method as defined in claim 1, further including providing a signal to ones of switches, certain ones of switches closing upon reception of the signal and a fourth reference current detected at the sense amplifier based on the certain ones of switches that are closed.

4. A method as defined in claim 3, wherein the first reference current and the second reference current are summed with the third reference current in response to the certain ones of switches closing.

5. A method as defined in claim 1, wherein determining, with the sense amplifier, the bit cell logic state based on the first reference current, the second reference current, and the third reference current includes comparing the bit cell current to a fourth reference current, the fourth reference current equal in magnitude to a sum of the first reference current, the second reference current, and the third reference current.

6. A method as defined in claim 1, further including matching the sum of the first reference current, the second reference current, and the third reference current via a programmable current mirror.

7. An apparatus to track bit cell current, comprising:
   a first reference current generator to generate a first reference current based on bit cell temperature;
   a second reference current generator to generate a second reference current based on bit cell voltage;
   a current mirror to sum the first reference current and the second reference current with a third reference current; and
   a sense amplifier to determine a bit cell logic state based on the first reference current, the second reference current, and the third reference current.

8. An apparatus as defined in claim 7, wherein the third reference current is of a constant magnitude.

9. An apparatus as defined in claim 7, wherein at least one of the first reference current generator and the second reference current generator are to trim at least one of the first reference current and the second reference current, respectively.

10. An apparatus as defined in claim 8, wherein the current mirror is to sum at least one of the first reference current and the second reference current with the third reference current in response to an erase-verify operation in a memory architecture, the erase-verify operation resulting in a signal provided to ones of switches, certain ones of the switches closing upon reception of the signal.

11. An apparatus as defined in claim 8, wherein the sense amplifier is to determine the bit cell logic state by comparing the bit cell current to a fourth reference current, the fourth reference current equal in magnitude to a sum of the first reference current, the second reference current, and the third reference current.

12. An apparatus as defined in claim 8, further including a programmable current mirror to match a fourth reference current to a sum of the first reference current, the second reference current, and the third reference current, the fourth reference current equal in magnitude to the sum of the first reference current, the second reference current, and the third reference current and sensed at the sense amplifier.

13. An apparatus as defined in claim 7, wherein the first reference current generator and the second reference current generator are to include complementary metal oxide semiconductor transistors.

14. An apparatus to track bit cell current, comprising:
   a first reference current generator to generate a first reference current based on bit cell temperature;
   a second reference current generator to generate a second reference current based on bit cell voltage; and
   a sense amplifier to determine a bit cell logic state based on the first reference current and the second reference current;
   further including a third reference current generator to generate a third reference current of constant magnitude, the sense amplifier to determine the bit cell logic state based on the first reference current, the second reference current, and the third reference current.

15. An apparatus as defined in claim 14, wherein at least one of the first reference current generator and the second reference current generator are to generate at least one of the first reference current and the second reference current, respectively, in response to reception of a signal, the signal closing ones of switches and received in response to an erase-verify operation in a memory architecture.

16. An apparatus to track bit cell current, comprising:
a first reference current generator to generate a first reference current based on bit cell temperature;
a second reference current generator to generate a second reference current based on bit cell voltage; and
a sense amplifier to determine a bit cell logic state based on the first reference current and the second reference current;
wherein neither the first reference current generator nor the second reference current generator are to generate the first reference current and the second reference current, respectively, in response to at least one of a read operation, a write operation, and a program-verify operation in a memory architecture.

17. An apparatus to track bit cell current, comprising:
a first reference current generator to generate a first reference current based on bit cell temperature;
a second reference current generator to generate a second reference current based on bit cell voltage; and
a sense amplifier to determine a bit cell logic state based on the first reference current and the second reference current;
further including a programmable current mirror to match a fourth reference current to a sum of the first reference current, the second reference current, and a third reference current of constant magnitude, the fourth reference current equal in magnitude to the sum of the first reference current, the second reference current, and the third reference current and sensed at the sense amplifier.

* * * * *